United States Patent
Gruber et al.

(10) Patent No.: US 9,298,664 B2
(45) Date of Patent: Mar. 29, 2016

(54) MODULAR CONTROL APPARATUS

(71) Applicant: Pilz GmbH & Co. KG, Ostfildern (DE)

(72) Inventors: Winfried Gruber, Ostfildern (DE); Hermann Stadler, Ostfildern (DE); Patrick Hewer, Ostfildern (DE); Markus Winkler, Ostfildern (DE)

(73) Assignee: PILZ GMBH & CO. KG, Ostfildern (DE)

( * ) Notice: Subject to any disclaimer, the term of this patent is extended or adjusted under 35 U.S.C. 154(b) by 246 days.

(21) Appl. No.: 14/175,261

(22) Filed: Feb. 7, 2014

(65) Prior Publication Data

US 2014/0156900 A1    Jun. 5, 2014

Related U.S. Application Data

(63) Continuation of application No. PCT/EP2012/064682, filed on Jul. 26, 2012.

(30) Foreign Application Priority Data

Aug. 9, 2011    (DE) .......................... 10 2011 110 183

(51) Int. Cl.
*G06F 13/00*    (2006.01)
*G06F 13/40*    (2006.01)
(Continued)

(52) U.S. Cl.
CPC .......... *G06F 13/409* (2013.01); *G05B 19/0423* (2013.01); *H05K 7/1478* (2013.01)

(58) Field of Classification Search
CPC ................. G05B 2219/15078; G05B 19/0423; G06F 13/409; H05K 7/1478
USPC ............................ 710/300, 305; 361/728–747
See application file for complete search history.

(56) References Cited

U.S. PATENT DOCUMENTS 5,408,229 A * 4/1995 Yabusaki ............. G05B 19/054
340/4.3
5,629,831 A * 5/1997 Eggert .................. H01R 9/2658
361/624

(Continued)

FOREIGN PATENT DOCUMENTS

DE    196 51 961 A1    6/1998
DE    196 51 962 A1    6/1998

(Continued)

OTHER PUBLICATIONS

IPEA/EP; English language translation of International Preliminary Report on Patentability (Chapter II); mailed Feb. 13, 2014; 10 pp.

(Continued)

*Primary Examiner* — Paul R Myers
(74) *Attorney, Agent, or Firm* — Harness, Dickey & Pierce, P.L.C.

(57) ABSTRACT

A control apparatus has a number of modules arranged next to one another in a longitudinal direction. The modules each comprise at least one module part having a housing. Furthermore, the module part comprises a first electrical bus connector on a first side of the housing for electrical connection to a first neighboring module part adjacent in the longitudinal direction, and a second electrical bus connector on a second side, opposite the first side, of the housing for electrical connection to a second neighboring module part adjacent in the longitudinal direction. The module part further comprises at least one movable element, movable between a first position and a second position. In the first position, the movable element provides an electrical connection between the first bus connector and the second bus connector and, in the second position, provides an insulation point between the first bus connector and the second bus connector.

13 Claims, 14 Drawing Sheets

(51) Int. Cl.
*G05B 19/042* (2006.01)
*H05K 7/14* (2006.01)

(56) References Cited

U.S. PATENT DOCUMENTS

| | | | |
|---|---|---|---|
| 6,172,877 B1 | 1/2001 | Feye-Hohmann et al. | |
| 6,324,063 B1* | 11/2001 | Mohler | H01R 9/2658 361/728 |
| 6,916,192 B2 | 7/2005 | Gräff et al. | |
| 6,961,233 B2* | 11/2005 | Hoeing | H05K 7/1478 307/147 |
| 7,865,648 B2* | 1/2011 | Kuschke | H01R 9/2675 361/729 |
| 2007/0066147 A1 | 3/2007 | Braunlich et al. | |
| 2009/0002904 A1 | 1/2009 | Braunlich et al. | |
| 2011/0310521 A1* | 12/2011 | Dauer | H01H 9/22 361/102 |

FOREIGN PATENT DOCUMENTS

| | | |
|---|---|---|
| DE | 197 10 768 A1 | 9/1998 |
| DE | 10 2004 020 995 A1 | 11/2005 |
| DE | 10 2007 052 512 B3 | 4/2009 |
| EP | 1 021 939 B1 | 4/2004 |
| EP | 1 464 843 A1 | 10/2004 |
| EP | 1 515 050 A2 | 3/2005 |
| EP | 1 764 873 A1 | 3/2007 |
| EP | 2 009 522 A1 | 12/2008 |
| WO | 2006/056457 A2 | 6/2006 |

OTHER PUBLICATIONS

ISA/EP; International Search Report; mailed Oct. 30, 2012; 3 pp.
X20 System User's Manual-MAX20-ENG; May 2009; 1202 pp.
PSSuniversal-Programmable Control System PSS—No. 21256-EN-04; 92 pp.

* cited by examiner

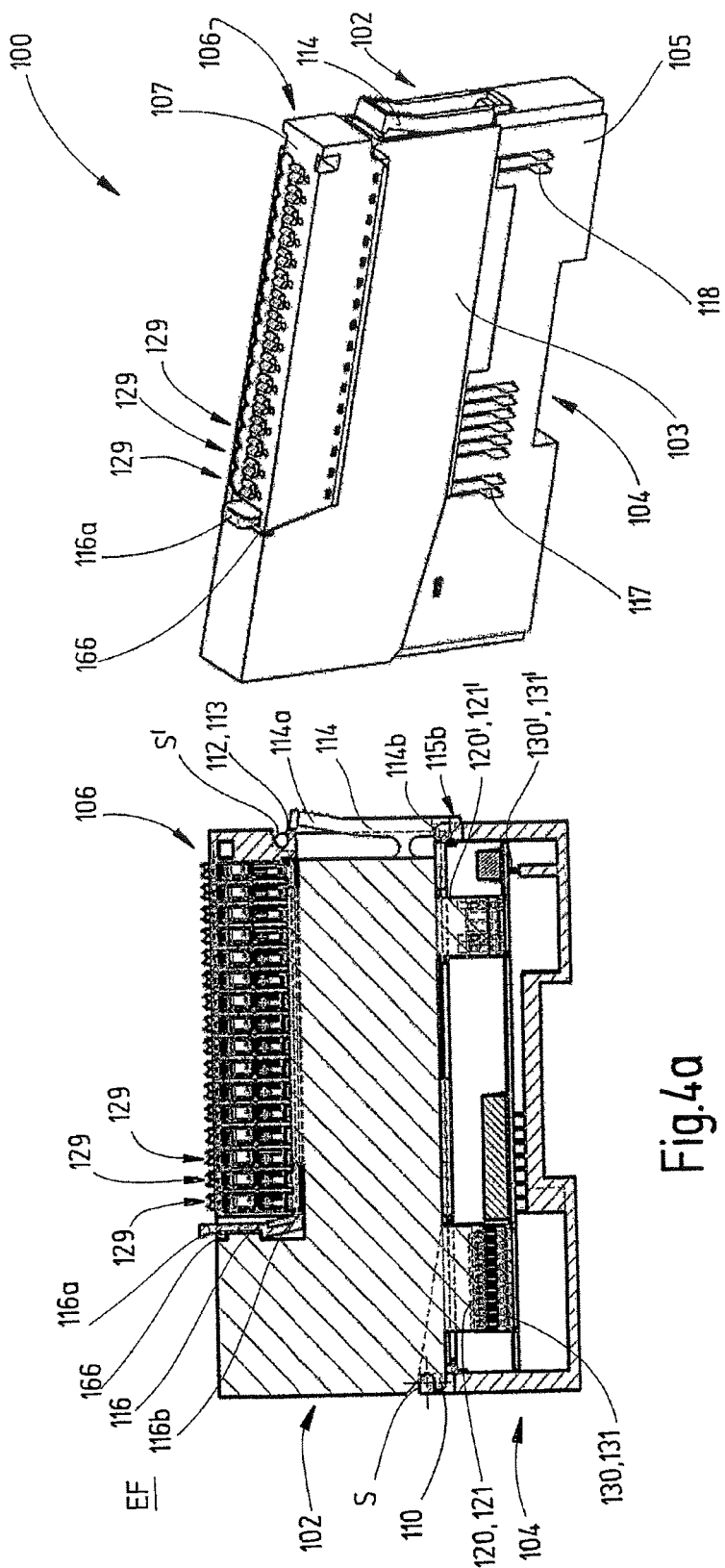

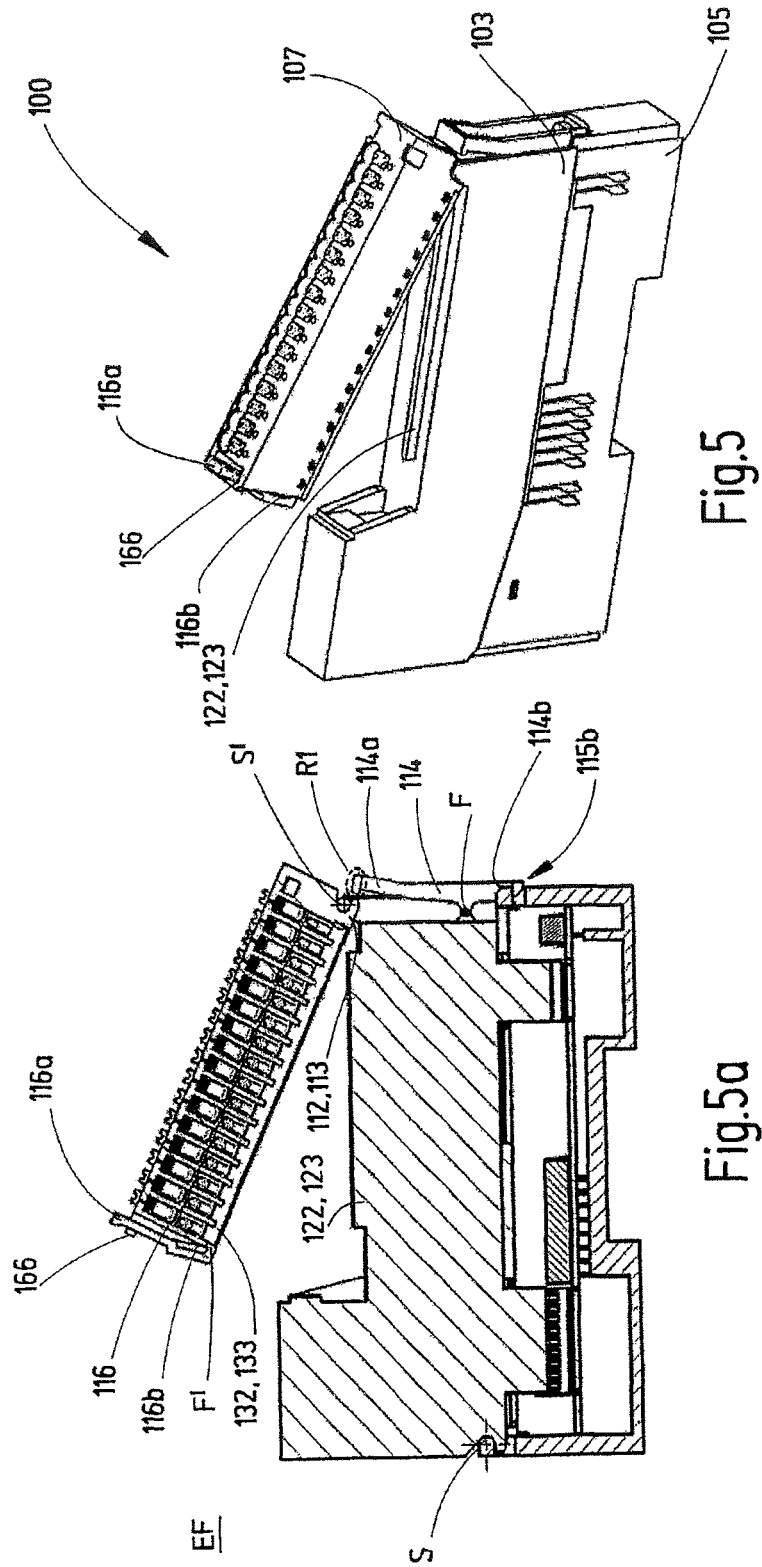

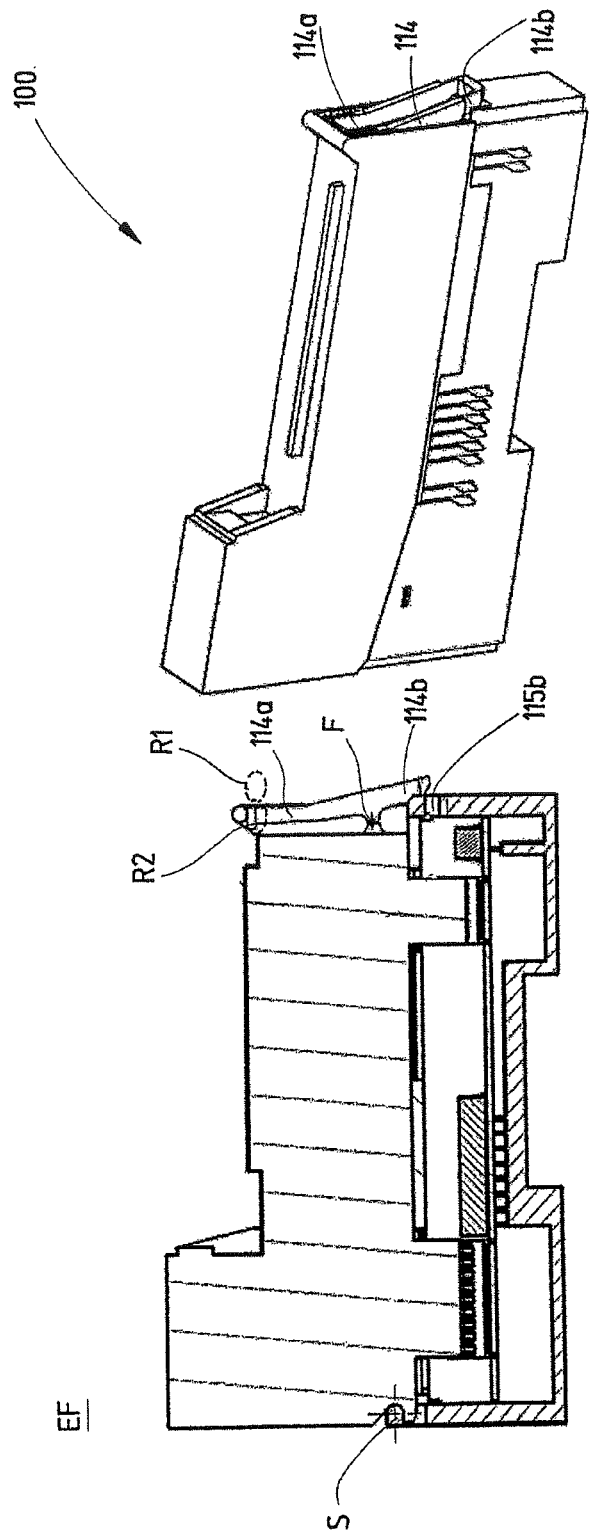

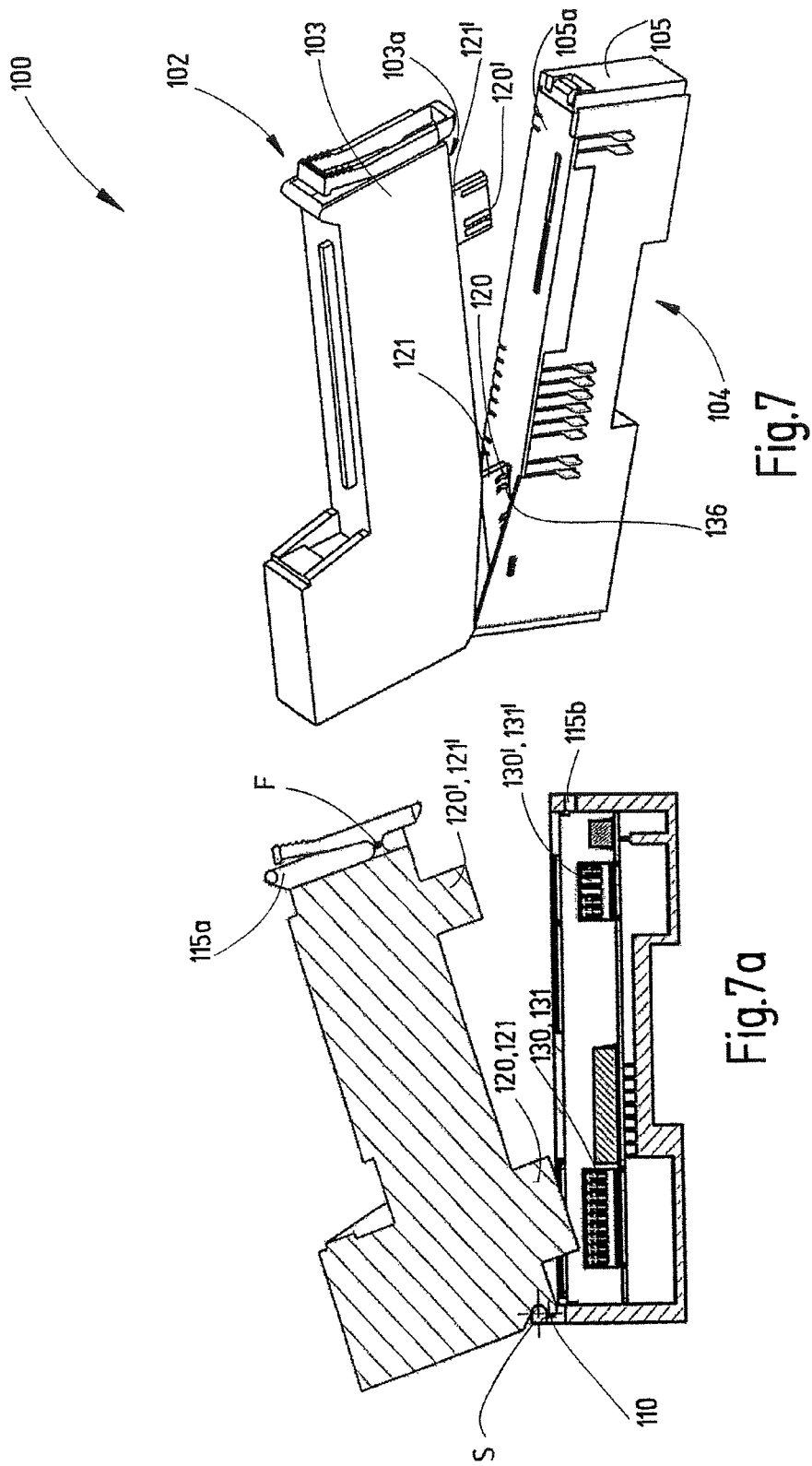

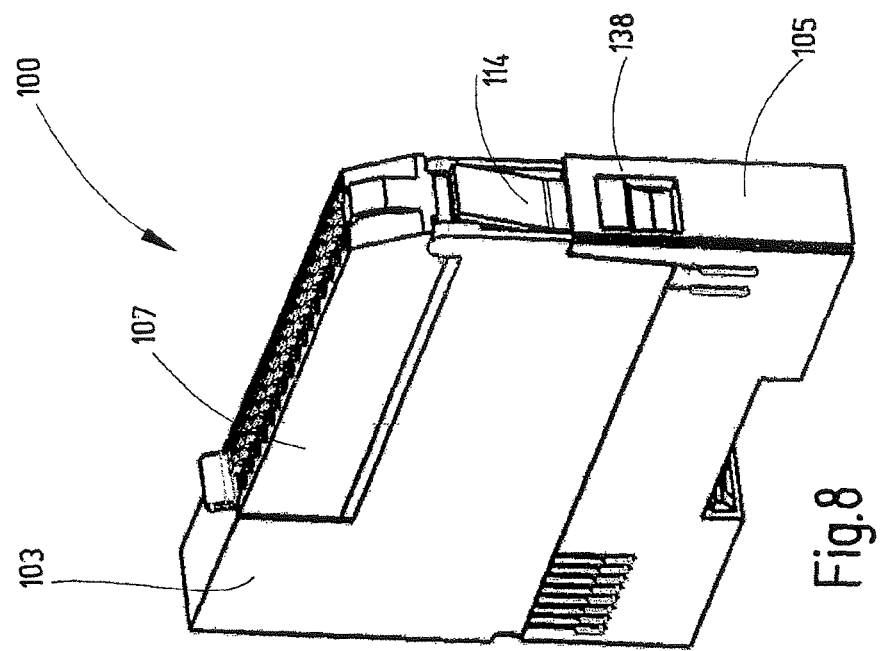
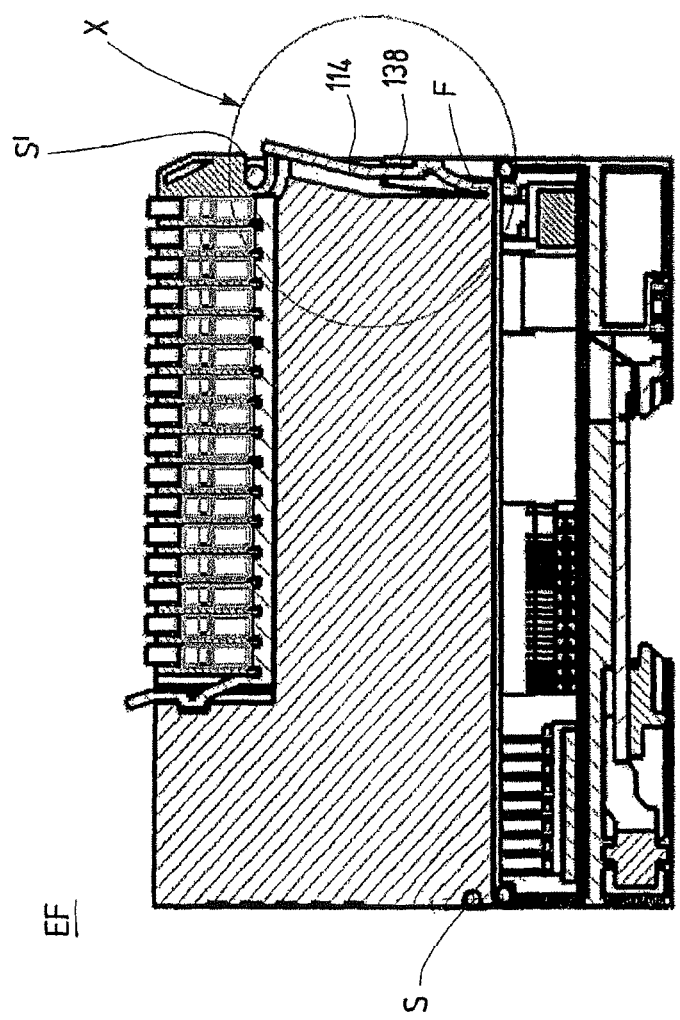

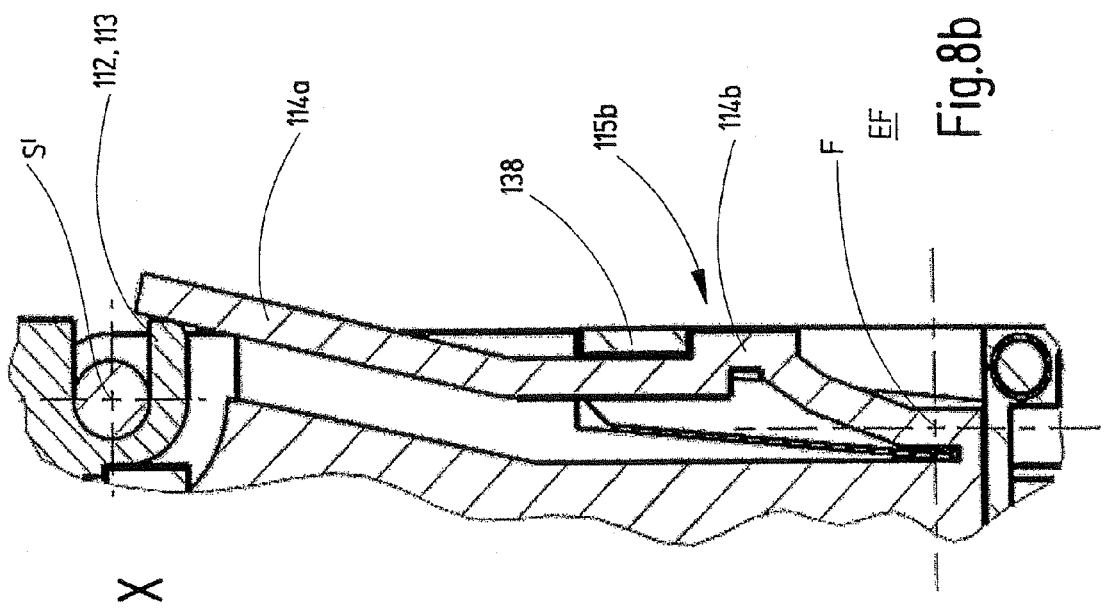

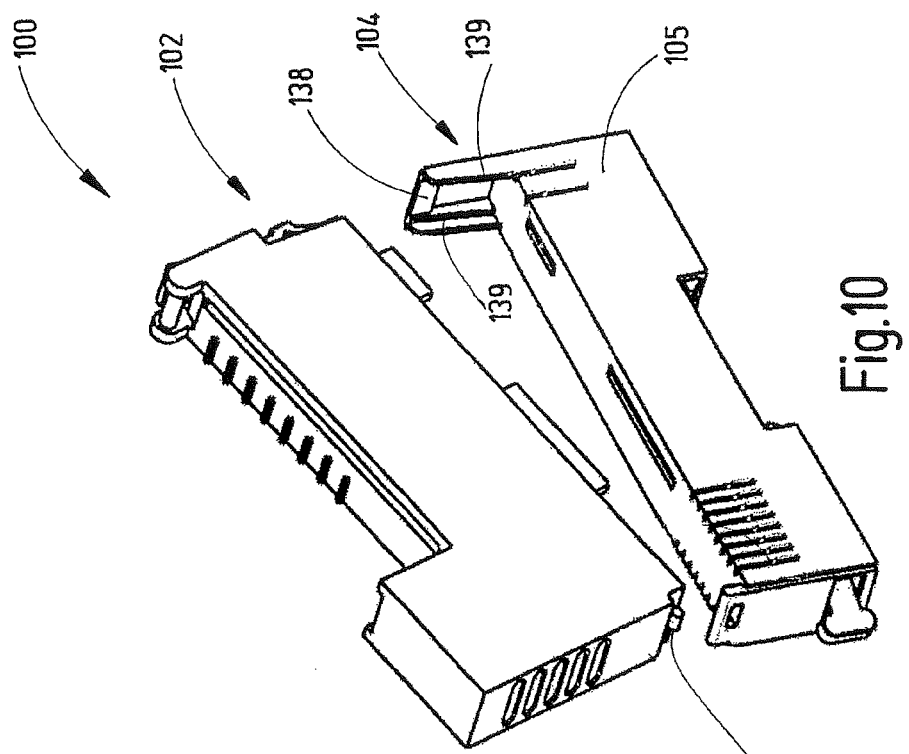
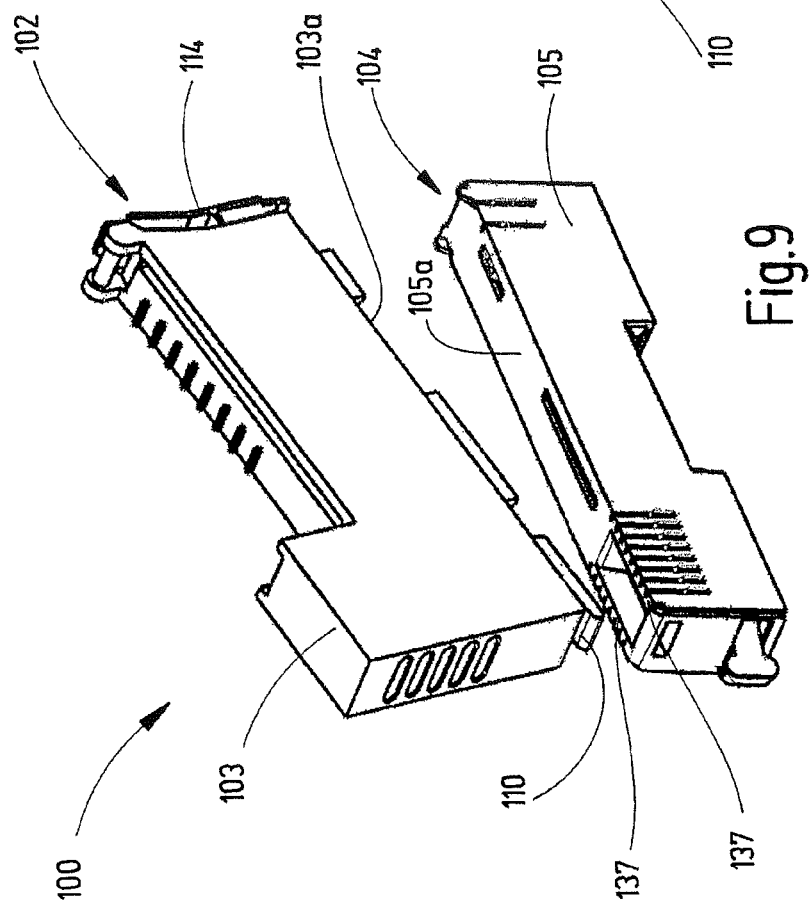

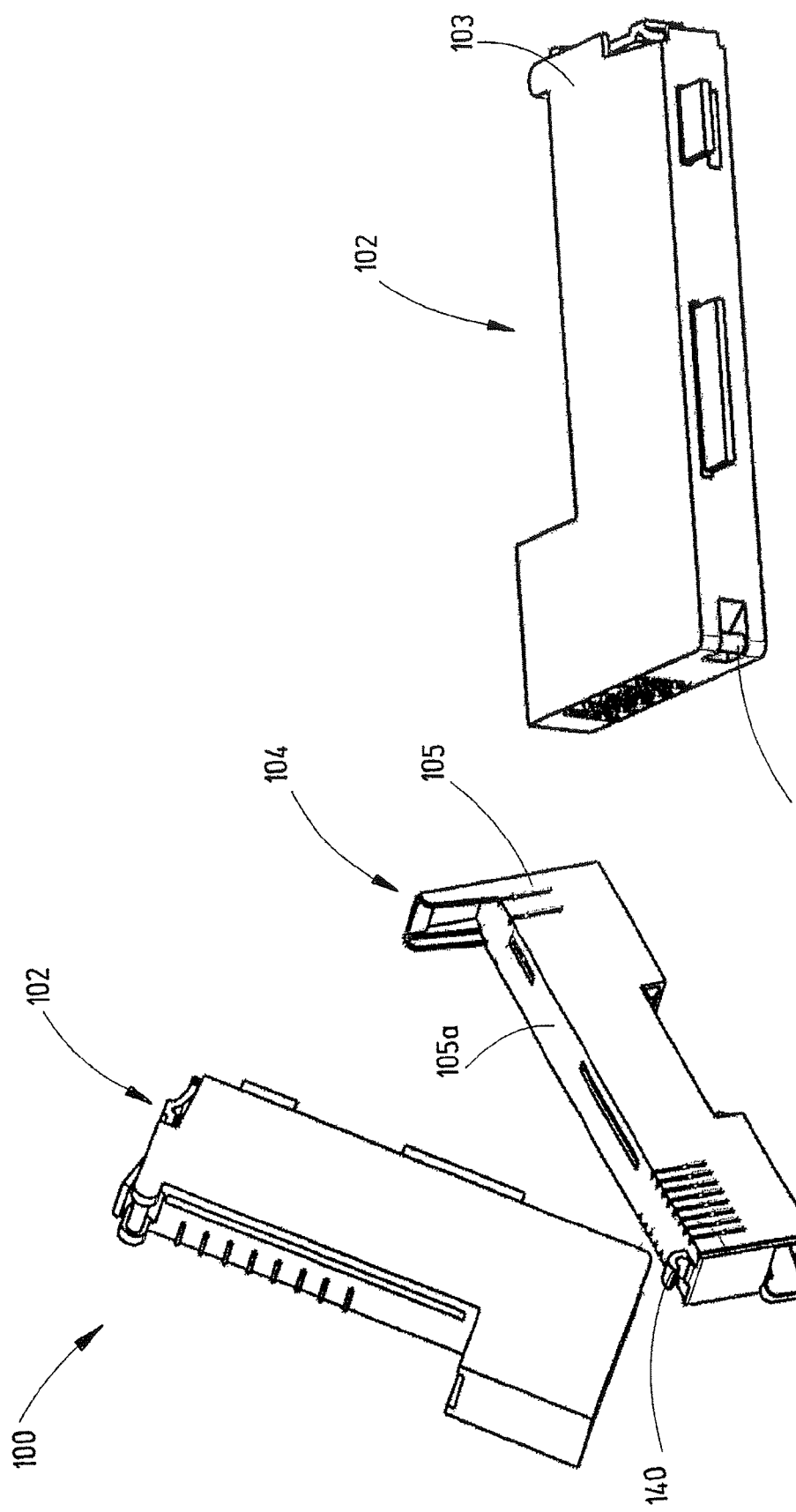

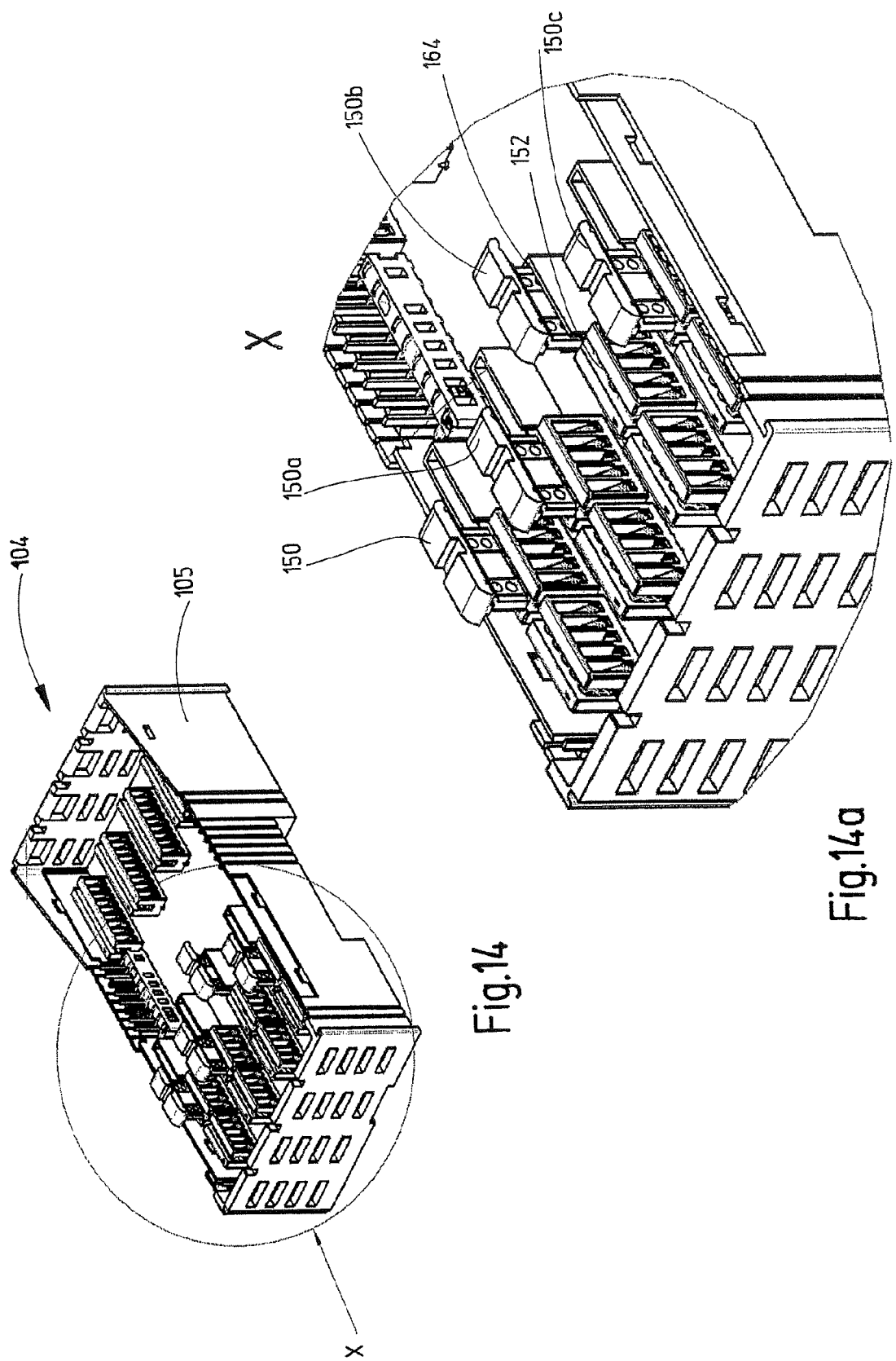

MODULAR CONTROL APPARATUS

CROSS-REFERENCES TO RELATED APPLICATIONS

This application is a continuation of international patent application PCT/EP2012/064682 filed on Jul. 26, 2012 designating the U.S., which international patent application has been published in German language and claims priority from German patent application DE 10 2011 110 183.0 filed on Aug. 9, 2011. The entire contents of these priority applications are incorporated herein by reference.

BACKGROUND OF THE INVENTION

The present invention relates to a modular control apparatus for the automated control of a technical installation.

A control apparatus in terms of the present invention can be, for example, a modular control apparatus such as, for example, it is marketed by the applicant of the present invention under the trade name PNOZ® or a programmable controller such as, for example, it is marketed by the applicant of the present invention under the trade name PSS®, or controllers similar to these.

In particular, applicant's PSSuniversal® provides a modular programmable control apparatus for standard and safety tasks, as described by the system description "Pilz, PSSuniversal, Programmable Control Systems PSS®, System Description, No. 21256-EN-04". In this case, a module comprises a first module part in the form of an electronics module part and a second module part in the form of a basic module part, also referred to as bus module part in the following. The electronics module part is plugged onto the bus module part by virtue of a linear movement.

The electronics module part in this system has two different designs. In a first design, the electronics module part can be an input/output module part (for example for failsafe (FS) or standard (ST) applications). In a second design, the electronics module part can be a voltage supply module part, also referred to as feed module, for feeding a module supply, i.e. an internal supply voltage, or for feeding a periphery supply, i.e. an external supply voltage. It is thus possible for a plurality of voltage groups to be formed. For the first design (input/output module part), a corresponding bus module part is used which has bus connectors in both directions (towards the right and towards the left) of the longitudinal direction in order to connect the supply voltage from the module adjacent on the left-hand side onto the module adjacent on the right-hand side. This design is therefore also referred to as a design with connected bus. For the second design (voltage supply module part), a special bus module part is required which does not have a connection to the supply voltage bus in a first direction (for example towards the left) and has a connection to the supply voltage bus in the other direction (for example towards the right) in order to pass on the supply voltage only to the modules adjacent on the right-hand side. That is to say that, when forming a new voltage group, the connection on the supply voltage bus needs to be interrupted by a suitable bus module part. Therefore, this design is also referred to as the design with interrupted bus. Accordingly, two designs of the second module part (bus module part) have to be provided, firstly with connected bus and secondly with interrupted bus.

A control apparatus comprising a module with three module parts is known, for example, from the X20 system by B&R, as described in the system description "X20-System, User's Manual, Version: 2.10 (May 2009), Model number: MAX20-ENG". In this case, a module comprises a first module part in the form of an electronics module part, a second module part in the form of a bus module part and a third module part in the form of a field terminal module part, also referred to as connection module part. The external connections in this system are accommodated in a separate connection module part.

In this system, too, the bus module part has two designs: a first design with a connected-through supply (referred to by X20BM11) and a second design with interruption of the supply in one direction (referred to by X20BM01). The latter design is used for connection to corresponding voltage supply module parts. As a result, different voltage groups can also be formed in this system.

A problem with such control apparatuses lies in the fact that a special design of the bus module part is necessary for a corresponding voltage supply module part. This increases the production costs and it may be complicated for the user to correctly assemble the appropriate designs of the module parts.

SUMMARY OF THE INVENTION

Against this background, it is an object of the present invention to provide a control apparatus of the type mentioned at the outset which have lower production costs and/or increased user friendliness.

In accordance with a first aspect of the invention, there is provided a control apparatus for automated control of a technical installation, comprising a plurality of modules which are arranged next to one another in a longitudinal direction, wherein the modules each comprise a bus module part, and wherein a first module from the plurality of modules additionally comprises an electronics module part and a connection module part, wherein the electronics module part and the bus module part of said first module are mechanically and electrically combined to form a first combined arrangement, and wherein the electronics module part and the connection module part of said first module are mechanically and electrically combined to form a second combined arrangement, wherein each bus module part comprises a housing having a first side and a second side opposite from the first side in the longitudinal direction, and comprises a first bus connector on the first side for electrical connection to a first neighboring bus module part adjacent in the longitudinal direction, and comprises a second bus connector on the second side for electrical connection to a second neighboring bus module part adjacent in the longitudinal direction, the first and second bus connectors establishing a supply voltage bus, wherein the connection module part comprises a first electrical contact and the electronics module part comprises a first electrical mating contact, which, in the second combined arrangement, makes contact with the first electrical contact for electrical connection between the electronics module part and the connection module part, wherein the electronics module part comprises a further electrical contact and the bus module part of said first module comprises a further electrical mating contact, which, in the first combined arrangement, makes contact with the further electrical contact for electrical connection between the electronics module part and the bus module part of said first module, wherein the bus module part of said first module further comprises at least one movable element, which is selectively movable between a first position and a second position, the movable element, in the first position, providing an electrical connection between the first bus connector and the second bus connector and, in the second position, providing an insulation point between the first bus connector and the second bus connector, wherein the connection module part further comprises an external connector for applying an external supply voltage, and wherein the electronics module part feeds the external supply voltage from the connection module part to the bus module part using the further electrical contact and the further electrical mating contact, while the movable element is in the second position.

In accordance with a further aspect of the invention, there is provided a control apparatus for the automated control of a technical installation, comprising a plurality of modules which are arranged next to one another in a longitudinal direction, wherein the modules each comprise a bus module part, said bus module part comprising a housing, wherein said bus module part further comprises at least one first electrical bus connector on a first side of the housing for electrical connection to a first neighboring bus module part which is adjacent in the longitudinal direction, and wherein said bus module part further comprises at least one second electrical bus connector on a second side of the housing, opposite the first side, for electrical connection to a second neighboring bus module part which is adjacent in the longitudinal direction, said first and second bus connectors thereby establishing a supply voltage bus for carrying a supply voltage, wherein said bus module part comprises at least one movable element, which is movable between a first position and a second position, wherein the at least one movable element, in the first position, provides an electrical connection between the first bus connector and the second bus connector in order to connect through the supply voltage and, in the second position, provides an insulation point between the first bus connector and the second bus connector.

The novel control apparatus therefore makes it possible for, in the first position of the movable element, a voltage present at one of the bus connectors to be connected between the first and second bus connectors and, in the second position of the movable element, galvanic isolation to be provided between the first and second bus connectors. Instead of two different designs of the module part (one design with connected bus and one design with interrupted bus), in this case only a single design of the module part (also referred to as bus module part) is therefore required.

Overall, the novel control apparatus and the novel module or module part therefore enable reduced production costs and increased user friendliness. The abovementioned object is therefore completely achieved.

In a first refinement, the module part is a second module part, and at least one module comprises said second module part and furthermore a first module part. The first module part and the second module part can be mechanically and electrically combined to form a first combined arrangement. The first module part comprises at least one first electrical contact. The second module part comprises at least one first electrical mating contact, which, in the first combined arrangement, makes contact with the first electrical contact for the electrical connection between the first and second module parts.

In this refinement, a modularity of the module is provided. It is thus possible for the individual module parts to be assigned different functions.

In a further refinement, the first module part comprises a signal processing unit. Thus, the function of an electronics module part is assigned to the first module part, and the function of a bus module part is assigned to the second bus module part.

In a further refinement, at least one of the first module parts has a basic width in the longitudinal direction, and the second module part has a width in the longitudinal direction which is an integer multiple of the basic width.

In this refinement, a granularity of a so-called backplane formed by the second module parts is achieved. Fewer second module parts are required here in comparison with the use of exclusively second module parts of a width corresponding to the basic width. The second module part can thus be provided, for example, in two width forms with different widths, namely in one width form with the basic width and in a second width form with a width which is an integer multiple of the basic width. The integer multiple can in particular be an even-numbered multiple.

This refinement is particularly advantageous in combination with any of the other described refinements. However, it can in particular also be implemented separately.

In a further refinement, the second module part (in the second width form) comprises a number of movable elements which corresponds to the integer, which movable elements are each movable into the first position and the second position. Each of the movable elements comprises an electrical line, which is arranged in such a way that, by virtue of the electrical lines, an electrical connection is provided between the first bus connector and the second bus connector when each of the movable elements is in the first position. Each of the movable elements in its second position provides an insulation point between the first bus connector and the second bus connector.

In this refinement, it is freely selectable where and how many first module parts are positioned on a second module part. If a corresponding movable element is in the first position, the bus is connected at this point. It is not necessary for a first module part to be positioned here. However, if a corresponding movable element is in the second position, the bus is interrupted at this point and a corresponding first module part (electronics module part or feed module part) is positioned.

In a further refinement, at least one other of the first module parts has a width in the longitudinal direction which is an integer multiple of the basic width.

In this refinement, the first module part is provided in two width forms with two different widths, namely in a first width form with the basic width and in a second width form with a width which is an integral multiple of the basic width. In the second width form, the first module part can be arranged beyond a disconnection point between two mutually adjacent second module parts. The integer multiple can in particular be an even-numbered multiple.

In a further refinement, the second module part has a first contact point, which is electrically connected to the first bus connector, and a second contact point, which is electrically connected to the second bus connector. The insulation point is located between the first contact point and the second contact point when the movable element is in the second position.

In this refinement, a simple implementation of the insulation point is provided. The insulation point is formed between two contact points.

In a further refinement, the electrical mating contact is one of the contact points, with the result that, in the first combined arrangement, the first electrical contact makes contact with one contact point of the second module part for the electrical connection between the first and second module parts when the movable element is in the second position in order to provide a feed connection.

In this refinement, the supply of a voltage, in particular an operating voltage, from the first module part to the second module part is enabled. This supplied voltage can then be passed to one bus connector, but not to the other. This makes it possible for the first module part in the form of a supply voltage module part (or feed module part) to be connectable to the second module part (bus module part) in order to supply or feed a supply voltage from the first module part to the second module part.

In a further refinement, the first electrical contact of the first module part is insulated from the other contact point of the second module part.

This refinement ensures that the supplied (operating) voltage is only passed to one connection, but not to the other bus connector. That is to say that the supply voltage can only be passed on in one direction on the bus, for example only towards the right or only towards the left. Therefore, a feed of a new or further voltage is possible, with the result that a new or further voltage group can be formed.

In a further refinement, the movable element comprises at least one electrical line, which is arranged in such a way that, by virtue of the electrical line, an electrical connection is provided between the first contact point and the second contact point and/or between the first bus connector and the second bus connector when the movable element is in the first position.

By virtue of this refinement, connection of the voltage between the first and second bus connectors is enabled.

In a further refinement, the module part further comprises a further connector, which is connected to the electrical connection between the first bus connector and the second bus connector.

In this refinement, a further connector is provided when the bus is connected through. It is thus possible for the voltage connected between the first and second bus connectors to be tapped off when the movable element is in the first position.

In a further refinement, the first module part has a first and a second design, wherein the first module part with the first design has its first electrical contact arranged in such a way that, in the first combined arrangement, the first electrical contact, together with the further connector, provides an electrical connection between the first and second module parts.

In this refinement, the first module part is provided with two different designs, for example an input/output module part in a first design and a supply voltage module part (or feed module part) in a second design. For the first design of the first module part (for example input/output module part), the movable element needs to be in the first position, with the result that the connected voltage can be tapped off. The voltage tapped off can then be used by the first module part.

In a further refinement, the first module part with the second design has its first electrical contact arranged in such a way that, in the first combined arrangement, the first electrical contact, together with the feed connector, provides an electrical connection between the first and second module parts for feeding a voltage from the first module part to the second module part.

In this refinement, in the case of the second design (for example supply voltage module part), a voltage of the first module part is supplied or fed by the first module part to the second module part.

In a further refinement, the insulation point is an air-filled region when the movable element is in the second position.

In this refinement, a simple and therefore inexpensive type of interruption or disconnection is provided. Alternatively, the insulation point can also be formed in another suitable way. For example, an insulating material can be arranged in the insulation point.

In a further refinement, the movable element is a sliding element which is guided on a guide and is capable of shifting between the first and second positions.

In this refinement, a simple and therefore inexpensive embodiment of the movable element is provided. The sliding element is capable of shifting, for example linearly, between the first and second positions, in particular parallel to the interface or backplane. Alternatively, the sliding element can be capable of shifting or rotating, for example, in angular fashion about a defined center of rotation between the first and second positions.

In an alternative refinement, the movable element is a jumper, which can be or is inserted into the insulation point in the first position and can be or is removed from the control apparatus in the second position.

In this refinement, a simple and therefore inexpensive embodiment of the movable element is provided. A jumper is in this case understood to mean a separate, completely removable component with an electrical line. For example, a plug-in station can be provided in the vicinity of the insulation point, into which plug-in station the jumper can be inserted in the second (removed) position or can be retained therein.

In a further refinement, the first bus connector and the second bus connector each are a bus connector of a supply voltage bus which connects a supply voltage. Alternatively, the first and second bus connectors each can be a bus connector of a communications bus, which transmits a communication signal between at least two modules.

In a further refinement, at least one module comprises at least the first module part, the second module part and a third module part. The first module part and the second module part can be mechanically and electrically combined to form a first combined arrangement. The first module part and the third module part can be mechanically and electrically combined to form a second combined arrangement.

In a further refinement, the third module part comprises at least one external connection for supplying a signal or a voltage.

In a further refinement, the first module part has two redundant signal processing channels in order to process at least one input signal in a manner redundant with respect to one another. The two redundant signal processing channels each can be capable of performing logic signal combinations in order to generate a signal depending on this. This signal can preferably be used to drive a switching element for shutdown of the technical installation. The at least one input signal can be a signal which is present at the external connection of the third module part. Preferably, the two signal processing channels process two input signals with redundancy with respect to one another. Each of the two input signals can then be a signal which is present at in each case one external connection of the third module part.

In this refinement, the corresponding module or module part implements safety tasks or safety functions. In particular, in this case the corresponding module or module part can be used for failsafe (FS) shutdown of the technical installation.

It goes without saying that the features mentioned above and yet to be explained below can be used not only in the respectively cited combination, but also in other combinations or on their own without departing from the scope of the present invention.

BRIEF DESCRIPTION OF THE DRAWINGS

Exemplary embodiments of the invention are illustrated in the drawing and will be explained in more detail in the description below. In the drawing:

FIG. 4 shows a perspective illustration of a first exemplary embodiment of a module with a first, second and third module part in a first and second combined arrangement, FIG. 4a shows a cross-sectional view of the module shown in FIG. 4, FIG. 5 shows a perspective illustration of the first exemplary embodiment of the module shown in FIG. 4 in a state in which the third module part is detached, FIG. 5a shows a cross-sectional view of the module shown in FIG. 5, FIG. 6 shows a perspective illustration of the first exemplary embodiment of the module shown in FIGS. 4 to 5 in a state in which the first module part is detachable in the first combined arrangement, FIG. 6a shows a cross-sectional view of the module shown in FIG. 6, FIG. 7 shows a perspective illustration of the first exemplary embodiment of the module shown in FIGS. 4 to 6 in a state in which the first module part is detached, FIG. 7a shows a cross-sectional view of the module shown in FIG. 7, FIG. 8 shows a perspective illustration of a second exemplary embodiment of a module comprising a first, second and third module part in a first and second combined arrangement, FIG. 8a shows a cross-sectional view of the module shown in FIG. 8, FIG. 8b shows an enlarged region X of the cross-sectional view shown in FIG. 8a, FIGS. 9-11 each show a perspective illustration of a further exemplary embodiment of a module comprising first and second module parts, FIG. 11a shows a perspective view of the first module part shown in FIG. 11, FIG. 14 shows a perspective internal view of the second module part shown in FIGS. 12 and 13, and FIG. 14a shows an enlarged region X of the perspective internal view shown in FIG. 14.

DESCRIPTION OF PREFERRED EMBODIMENTS

Figure 1:
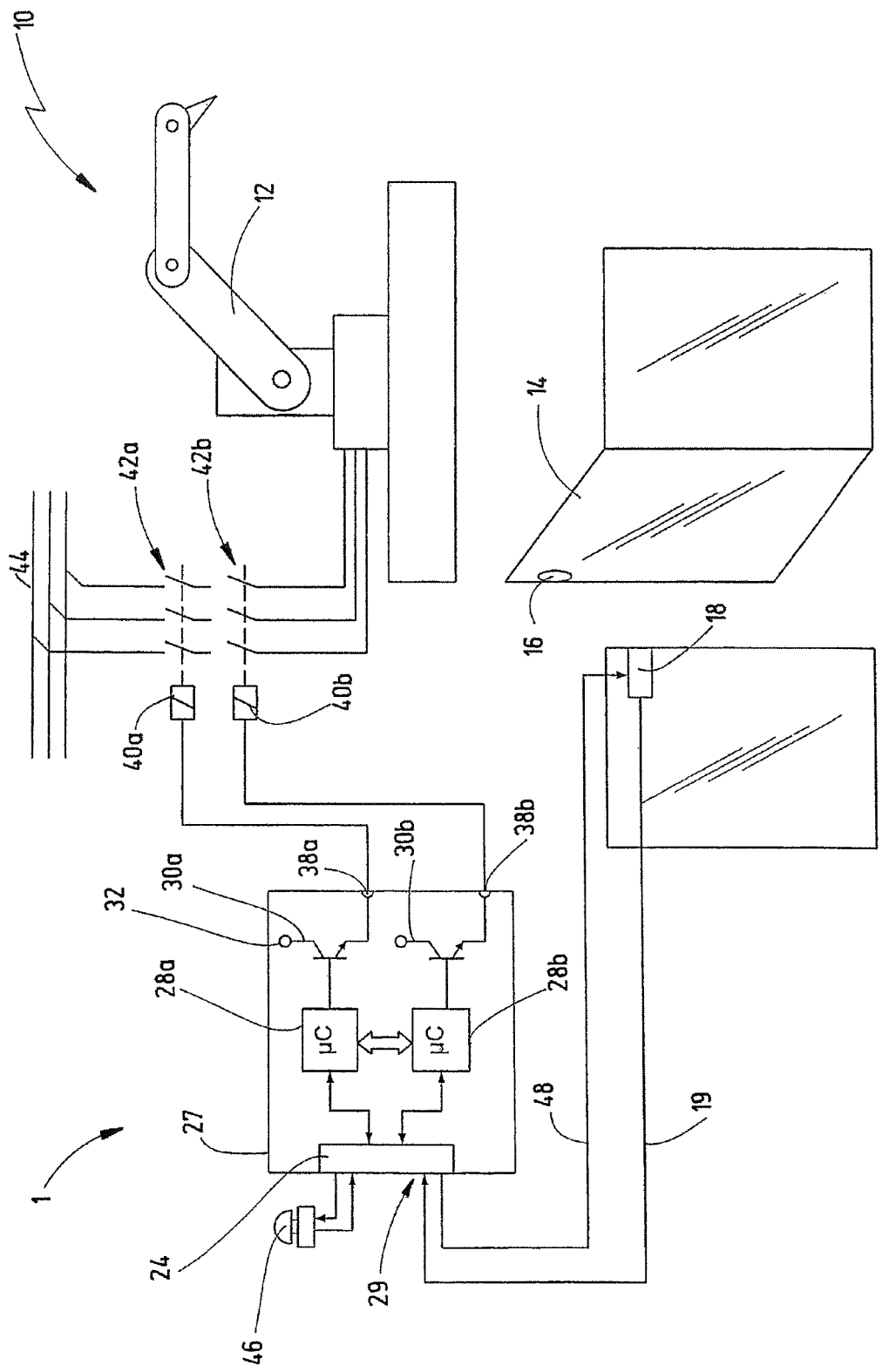
FIG. 1 shows a simplified illustration of a technical installation with an exemplary embodiment of the control apparatus.

FIG. 1 illustrates a technical installation 10 with an exemplary embodiment of the novel control apparatus 1 for the automated control of the technical installation 10. In this exemplary embodiment, the control apparatus 1 is configured for the failsafe shutdown of the installation 10, i.e. the control apparatus 1 is used for safety tasks. The installation 10 in this case comprises, by way of example, a robot 12, whose movements during working operation pose a risk to people in the working area of the robot 12. For this reason, the working area of the robot 12 is safeguarded by a safety fence with a safety door 14. The safety door 14 enables access into the working area of the robot 12, for example for maintenance work or for setup work. During normal working operation, however, the robot 12 should only be able to operate when the safety door 14 is closed. As soon as the safety door 14 is opened, the robot 12 needs to be shut down or brought into a safe state in another way.

In order to detect the closed state of the safety door 14, a safety door switch with a door part 16 and a frame part 18 is fitted to the safety door 14. The frame part 18 generates a safety door signal on a line 20, which signal is transmitted to the novel control apparatus 1 via line 20.

In this exemplary embodiment, the control apparatus 1 has an I/O part 24 with a plurality of connectors (external device connectors) 29. In some exemplary embodiments, the connectors 29 are connection terminals or field terminals which are arranged on one housing side of the housing 27 of the control apparatus 1, for example on a connection module part, as will be explained below. For example, these may be spring-loaded terminals or screw terminals. In other exemplary embodiments, the connectors can be male connectors or female connectors which contain a plurality of contact elements (pins), wherein in each case one pin forms one connection. Often, female M8 connectors with five contact pins are used for the connection of signaling devices or other sensors on field level. Correspondingly, exemplary embodiments of the novel control apparatus can be or can comprise field devices which are arranged outside a switchgear cabinet in the physical vicinity of the robot 12.

In this exemplary embodiment, the control apparatus 1 has two redundant signal processing channels. By way of example, in this case two microcontrollers 28a, 28b are illustrated, which are each connected to the I/O part 24. The microcontrollers 28a, 28b in this case process, with redundancy with respect to one another, input signals which are picked up by the control apparatus 1 at the device connectors of the I/O part 24, and said microcontrollers compare the results of this, which is illustrated by an arrow 29. Instead of two microcontrollers 28a, 28b, microprocessors, ASICs, FPGAs and/or other signal-processing circuits can be used. Preferably, exemplary embodiments of the control apparatus 1 have at least two signal-processing channels which have redundancy with respect to one another and which are each capable of performing logic signal combinations in order to generate a signal depending thereon. This signal is then used to drive a switching element for shutting down the robot 12. Such a control apparatus 1 can then be used for the failsafe (FS) shutdown of the installation 10, in this case the robot 12.

In the case illustrated here, the control apparatus 1 has two redundant switching elements 30a, 30b. Each of these two switching elements is capable of connecting a high voltage potential 32 to a device connector 38a, 38b of the control apparatus 1 in order to enable a current flow to a contactor 40a, 40b or to interrupt this current flow. Thus, each of the switching elements 30 can shut down an actuator, such as a contactor or a solenoid valve.

The contactors 40a, 40b each have working contacts 42a, 42b. The working contacts 42a, 42b are in this case arranged in series with one another in a power supply path from a power supply 44 to the robot 12. As soon as the control apparatus 1 shuts down the contactors 40a, 40b, the contacts 42 drop out and the power supply for the robot 12 is shut down. It is clear to those skilled in the relevant art that such a "radical" shutdown is described here by way of example. As a deviation from this, in the case of a safety requirement only parts of the robot 12 may be shut down, such as the hazardous drives, while other parts of the robot 12 may remain functional. A delayed shutdown is also conceivable in order that the robot 12 can be braked in a controlled manner, possibly prior to the shutdown of the drives.

The control apparatus 1 controls the switching elements 30a, 30b in this case depending on the signal of the safety door switch on the line 19 and depending on a further input signal from an emergency stop button 46. The emergency stop button 46 is also connected to device connectors of the control apparatus 1 via lines. Preferably, each of the input signals can be present in redundant fashion or in each case two input and output lines or connections may be provided (not illustrated in FIG. 1). In the example shown in FIG. 1, therefore, two input lines or inputs may be provided for the emergency stop button 46, which input lines or inputs each provide an input signal from the emergency stop button 46. The same applies to the signal of the safety door switch.

In some exemplary embodiments, the control apparatus 1 generates output signals which are transmitted to the individual signaling devices. By way of example, such an output signal is passed via a line 48 to the frame part 18 of the safety door switch. The frame part 18 loops the output signal of the safety switching device 1 from the line 48 onto the line 19 when the door part 16 is located in the vicinity of the frame part 18, i.e. when the safety door 14 is closed. Therefore, the control apparatus 1 can monitor the safety door switch with the aid of the output signal on the line 48 and with the aid of the input signal on the line 19. In a similar manner, the control apparatus 1 in this case monitors the emergency stop button 46.

As a deviation from the illustration in FIG. 1, in practice two redundant output signals of the control apparatus 1 are often used which are each passed via a separate signal line to a signaling device and are looped back to the control apparatus 1 via this signaling device. Reference is made by way of example for such an embodiment to DE 10 2004 020 995 A1, which is incorporated by reference in respect of the details relating to such a redundant monitoring of a signaling device. The emergency stop button 46 is also often in practice monitored using redundant input and output lines, as mentioned above.

In the exemplary embodiment illustrated in FIG. 1 of the control apparatus 1, the control apparatus is used for safety tasks, in particular for the failsafe (FS) shutdown of an installation. However, the control apparatus 1 can also be used for non-safety-related tasks or standard tasks (ST).

The control apparatus 1 can be in particular a programmable control apparatus for programmable control of the technical installation. Alternatively, the control apparatus 1 can also be a configurable control apparatus. Configurable is in this case understood to mean matching or adjusting of a hardware component of the controller, such as wiring, for example. Programmable is in this case understood to mean matching or adjusting of a software component of the controller, for example by means of a programming language.

The control apparatus 1 can comprise at least one bus, in particular a communications bus and/or supply voltage bus. For example, the control apparatus 1 can be a decentralized control apparatus, whose components are connected to one another via a bus. The control apparatus can comprise in particular a head module for coordination of the data traffic on the (communications) bus. In the case of a control apparatus 1 for safety tasks, the (communications) bus can be, for example, a failsafe bus such as SafetyBUS p or PROFINET. In the case of a control apparatus 1 for standard tasks, the bus can be, for example, a standard field bus such as CANOpen or DeviceNet or the like.

Figure 2:
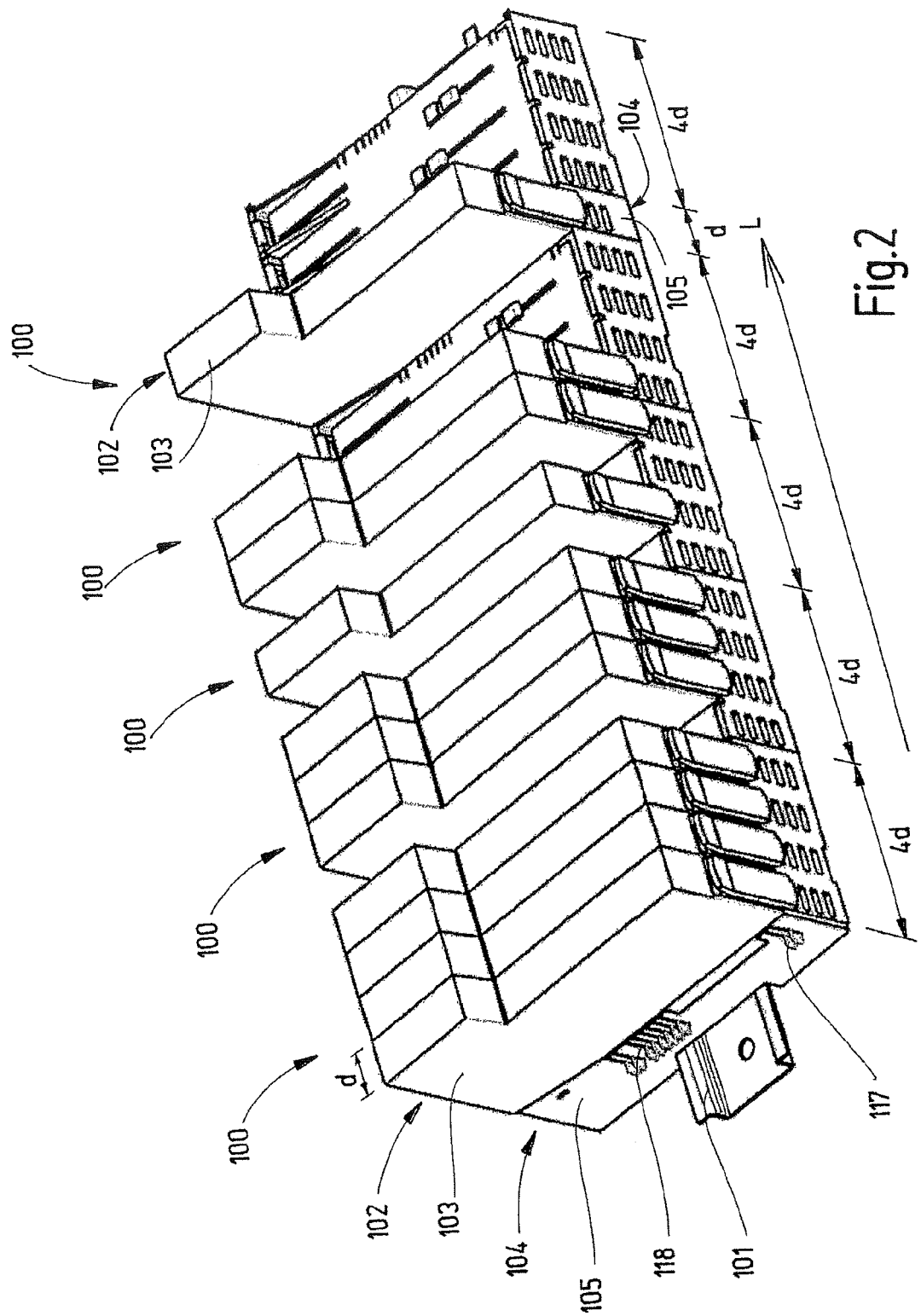
FIG. 2 shows a perspective illustration of an exemplary embodiment of the control apparatus with a plurality of modules arranged next to one another with first module parts and second module parts.

The control apparatus 1 is in particular a modular control apparatus comprising at least one module. FIG. 2 shows a perspective illustration of an exemplary embodiment of the modular control apparatus comprising a plurality of modules 100 arranged next to one another with first module parts 102 and second module parts 104. Third module parts 106 are not illustrated in FIG. 2. The first module part 102 comprises a housing 103. The second module part 104 comprises a housing 105. The second module part 104 comprises at least one bus connector 117, 118. The second module part 104 is therefore also referred to as bus module part in the following.

Figure 3:
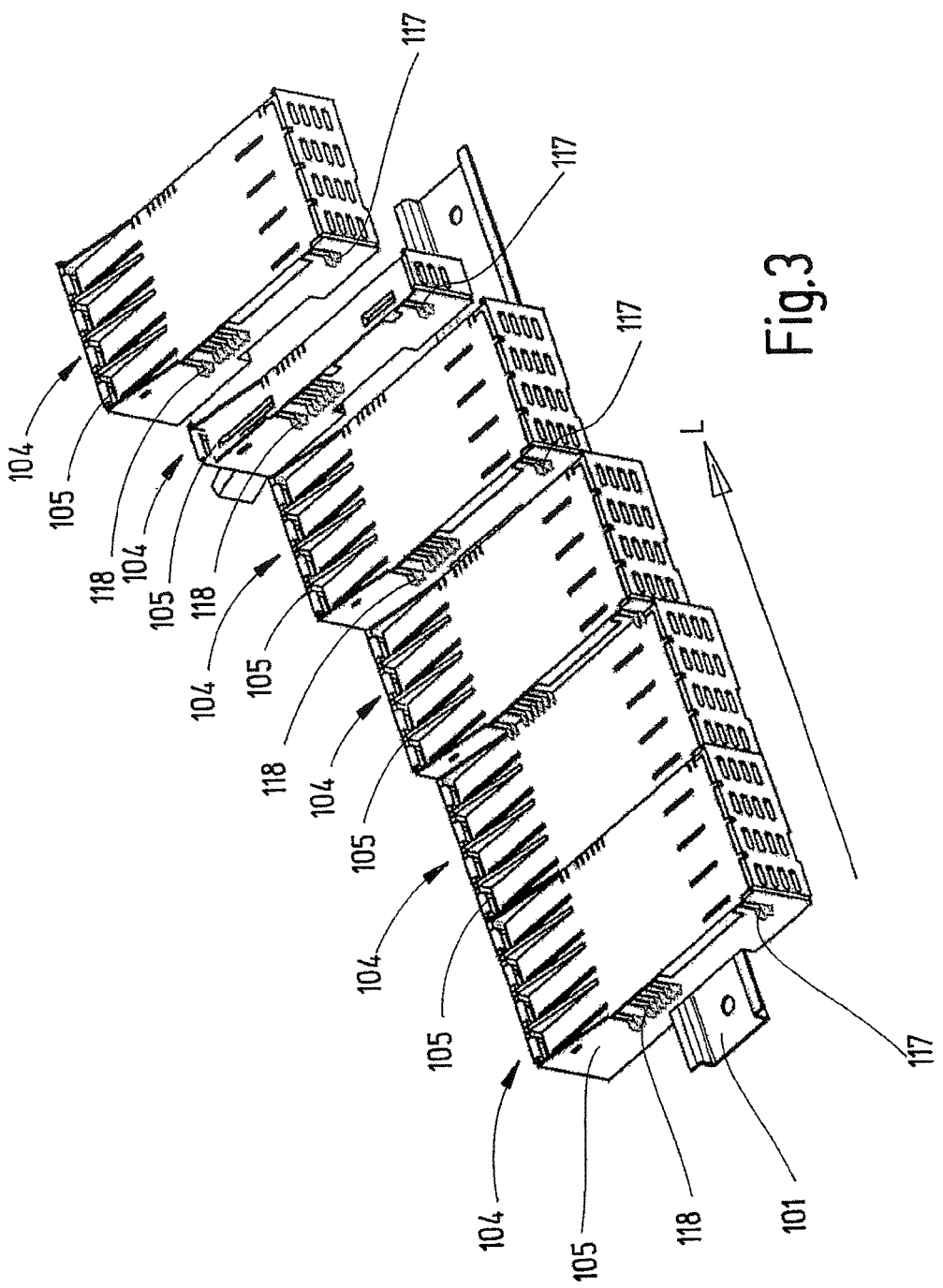
FIG. 3 shows a perspective illustration of the exemplary embodiment of the control apparatus shown in FIG. 2 with only second module parts.

FIG. 3 shows a perspective illustration of the exemplary embodiment of the control apparatus shown in FIG. 2 with only the second module parts (bus module parts) 104. The second module parts (bus module parts) 104 or the modules 100 are arranged next to one another in a longitudinal direction L. The second module parts 104 or the modules 100 are fitted on a guide rail 101, as shown in FIG. 3. The second module part (bus module part) 104 has a bus connector 117 for a supply voltage bus and a bus connector 118 for a communications bus. The second module part (bus module part) 104 comprises a first electrical bus connector 117, 118 on a first side of the housing 105 for electrical connection to a neighboring module part which is adjacent in the longitudinal direction L (in FIGS. 2 and 3 a neighboring module part which is adjacent on the right-hand side). The second module part (bus module part) 104 further comprises a second electrical bus connector 117', 118' (not shown in FIG. 3) on a second side, which is opposite the first side, of the housing 105 for the electrical connection to another neighboring module part which is adjacent in the longitudinal direction L (a neighboring module part which is adjacent on the left-hand side in FIG. 2 and FIG. 3). In particular, the second electrical bus connector 117', 118' can be connected to the corresponding first electrical bus connector 117, 118 of the other neighboring module part. In this way, the supply voltage bus and the communications bus are connected through by the second module parts (bus module parts) 104.

The control apparatus 1 can furthermore comprise a head module (not illustrated in FIG. 2 and FIG. 3), which comprises interfaces and a processing part, in particular for coordination of the data traffic on the (communications) bus, as described above. The head module can then likewise be fitted on the guide rail 101. The head module can be arranged next to the second module parts (bus module parts) 104 or modules 100, in the longitudinal direction L, as described above. In FIG. 2 and FIG. 3, the head module can be arranged on the left-hand side next to the first module 100 in the longitudinal direction L, for example, and connected to the modules via the first bus connector 117, 118. Each module 100 or the corresponding first module part (electronics module part) 102), can be an I/O (input/output) module or module part. The I/O module or module part can be a failsafe (FS) module or a non-failsafe standard module (ST). By way of example, reference is made in respect of such an embodiment to WO 2005/003869 A1, which is incorporated by reference in respect of details relating to such a modular control apparatus.

As can be seen from FIG. 3, a so-called backplane is provided by the mutually adjacent second module parts (bus module parts) 104. Then, first module parts 102 can be arranged in freely selectable fashion on this backplane. The backplane in this case forms in particular a substantially planar face. A continuous arrangement of first module parts (electronics module parts) 102 next to one another in a row on the backplane is not necessary. As can be seen in FIG. 2, it is not necessary for a first module part (electronics module part) 102 to be arranged on a specific second module part (bus module part) 104 or a specific section of a basic width d of a second bus module part (bus module part) 104.

Again with reference to FIG. 2, at least one first module part 102 can be plugged onto a respective second module part 104 (bus module part). Preferably, the first module part 102 comprises an electrical control circuit for the automated control, for example using one or more processing units, as explained with reference to FIG. 1. The first module part 102 is also referred to below as electronics module part. The first module part 102 (electronics module part) and the second module part 104 (bus module part) can be mechanically and electrically combined to form a first combined arrangement, as shown in FIG. 2. By virtue of this modular design of the control apparatus 1, it is possible to respond to changes and adaptations without considerable complexity.

In the exemplary embodiment illustrated in FIG. 2 and FIG. 3, the second module part (bus module part) 104 is provided with a plurality of width forms. The first module part (electronics module part) 102 has a basic width d in the longitudinal direction L. Some of the second module parts 104 (bus module part) each have a width in the longitudinal direction L which is an integer multiple (n times) the basic width d, in particular in this case a width which is four times the basic width d (denoted by 4d in FIG. 2 and FIG. 3). In this case, the integer multiple is therefore an even-numbered multiple, namely 4. Four times the basic width has proven to be particularly suitable for the assembly of a relatively large backplane. However, any other suitable integer multiple can also be selected.

As can be seen from the exemplary embodiment in FIG. 2 and FIG. 3, another second module part (bus module part) 104 has a width which corresponds to the basic width d. The second module part (bus module part) is therefore provided in two width forms with different widths, namely in a first width form with the basic width d and in a second width form with a width 4d, which is four times the basic width d. The backplane can thus be combined in freely selectable fashion by arranging second module parts (bus module parts) of the first and/or second width form next to one another. By providing second module parts (bus module parts) 104 with a width which is an integer multiple of the basic width d, fewer second module parts 104 are required in comparison with the use of exclusively second module parts 104 with the basic width d.

In the exemplary embodiment illustrated in FIG. 2, all of the first module parts (electronics module parts) 102 have the basic width d in the longitudinal direction L. However, it is also possible for other first module parts 102 to be provided which have a width in the longitudinal direction L which is an integer multiple of the basic width d (m times), in particular an even-numbered multiple (for example double). For example, other first module parts can have a width in the longitudinal direction which is double the basic width d. The first module part (electronics module part) is thus provided in two width forms with two different widths, namely in a first width form with the basic width d and in a second width form with a width which is an integer multiple (m times) the basic width d. The first module part in the second width form can then be arranged bridging a disconnection point between two second module parts (bus module parts) 104 adjacent to one another.

FIG. 4 shows a perspective illustration of a first exemplary embodiment of a module 100, which comprises a first module part 102, a second module part 104, and a third module part 106. FIG. 4a shows a corresponding cross-sectional view of the module 100 shown in FIG. 4. The first or second module part 102, 104 in this exemplary embodiment can be in particular a first or second module part as explained with reference to FIG. 2 and FIG. 3. The third module part 106 comprises a housing 107. The third module part 106 furthermore comprises at least one external connector 129 for supplying a signal or a voltage from the outside. The connectors 129 can in particular be or comprise the connectors 29 described with reference to FIG. 1. In FIG. 4 and FIG. 4a, a plurality of external connectors 129 are illustrated which are arranged adjacent to one another on the housing 107 of the third module part. The third module part 106 is therefore referred to as connection module part in the following. In the exemplary embodiment illustrated, the third module part 106 comprises sixteen external connectors 129, which are arranged in a single row (16-pole and single-row). However, it should be understood that any other suitable number and arrangement of external connectors may be provided. An external connector can be an output for transmitting an output signal (for example to an actuator) or an input for picking up an input signal (for example from a sensor).

As already explained with reference to FIG. 2, the first module part 102 and the second module part 104 can be mechanically and electrically combined to form a first combined arrangement. The first module part 102 and the third module part 106 can also be mechanically and electrically combined to form a second combined arrangement. FIG. 4 and FIG. 4a show the module parts in the first and second combined arrangements.

The mechanical assembly of the module parts will now be described in more detail below with reference to FIG. 4a. As can be seen from FIG. 4a, the third module part (connection module part) 106 has a pivoting holder element 112, on which the first module part (electronics module part) 104 can be or detachably is held. The pivoting holder element 112 thus defines a pivot point S' with a pivot axis A'. In this way, the first module part 102 and the third module part 106 can be mechanically combined by a pivoting movement along a defined movement path into the second combined arrangement. As can be seen from FIG. 4a, the first module part (electronics modular part) 102 also comprises a pivoting holder element 110, on which the second module part 104 (bus module part) is detachably held. The pivoting holder element 110 thus defines a pivot point S with a pivot axis A. In this way, the first module part 102 and the second module part 104 are combined by a pivoting movement along a defined movement path into the second combined arrangement. In the exemplary embodiment illustrated in FIG. 4a, the pivoting holder element 110, 112 in each case comprises a projection (for example curved projection, hook or the like), which engages in a cutout in the corresponding other module part. A pivotable connection is thus provided. The module parts can thus be combined safely and reliably by a simple pivoting movement about a fixedly defined pivot point. In the exemplary embodiment illustrated, the pivoting holder element 110 of the first module part 102 and the pivoting holder element 112 of the third module part are arranged on mutually opposite sides of the module 100. Thus, the third module part 106 can be pivoted away in a first direction (towards the right in FIG. 4a), and the first module part 102 can be pivoted away in a second direction opposite the first direction (towards the left in FIG. 4a).

The electrical assembly of the module parts will now be described in more detail below with reference to FIG. 4a. The first module part (electronics module part) 102 comprises at least one electrical contact 120 and the second module part (bus module part) 104 comprises at least one first electrical mating contact 130, which, in the first combined arrangement, makes contact with the first electrical contact 120 for the electrical connection between the first module part (electronics module part) 102 and the second module part (bus module part) 104. The first electrical contact 120 of the first module part 102 is a conductor track on a nonconductive plate, with the result that a printed circuit board 121 is formed.

The first mating contact 130 of the second module part 104 is a contact element (pin) which is arranged in a male or female connector 131. The printed circuit board 121 can be inserted into the male or female connector 131. Thus, a plug-type connection is formed. In particular, a plurality of electrical contacts 120 and a plurality of corresponding mating contacts 130 are provided. The plurality of contacts 120 are arranged next to one another on the printed circuit board 121. The plurality of corresponding mating contacts 130 are arranged correspondingly next to one another in the male or female connector 131.

As can be seen from FIG. 4 and FIG. 4a, the contacts 120 and the corresponding mating contacts 130 each form a first group. In this exemplary embodiment, the first group serves the purpose of transmitting the voltage or the signal of the communications bus which is connected by means of the bus connectors 117 from the second module part (bus module part) 104 to the first module part (electronics module part) 102. Furthermore, a second group of contacts 120' is provided on a corresponding printed circuit board 121', and corresponding mating contacts 130' are provided in a male or female connector 131', as already described with reference to the contacts 120 and mating contacts 130. In this exemplary embodiment, the second group of contacts 120' or mating contacts 130' serves the purpose of transmitting the voltage of the supply voltage bus, which is connected by means of the bus connectors 118, from the second module part (bus module part) 104 to the first module part (electronics module part) 102.

FIG. 5 shows a perspective illustration of the first exemplary embodiment of the module 100 shown in FIG. 4 in a state in which the third module part (connection module part) 106 is detached. FIG. 5a shows a corresponding cross-sectional view of the module 100 shown in FIG. 5. As can be seen from FIG. 5 and FIG. 5a, the third module part (connection module part) 106 also comprises at least one first electrical contact 132, and the first module part (electronics module part) 102 comprises at least one corresponding first electrical mating contact 122, which, in the second combined arrangement, makes contact with the first electrical contact 132 of the third module part (bus module part) 106 for the electrical connection between the first module part (electronics module part) 102 and the third module part (connection module part) 106. The first electrical mating contact 122 of the first module part 102 is a conductor track on a nonconductive plate, with the result that a printed circuit board 123 is formed. The first electrical contact 132 of the third module part 106 is a contact element (pin) which is arranged in a male or female connector 133. The printed circuit board 123 can be inserted into the male or female connector 133. Thus, a plug-type connection is formed. In particular, a plurality of first electrical contacts 132 of the third module part 106 and a plurality of corresponding first electrical mating contacts 122 of the first module part 102 are provided. The plurality of first electrical contacts 132 of the third module part 106 are arranged next to one another in the male or female connector 133. The plurality of corresponding first electrical mating contacts 122 of the first module part 102 are arranged correspondingly next to one another on the printed circuit board 123.

In order to secure the first and second module parts 102, 104 in the first combined arrangement against one another, the first module part 102 (electronics module part) comprises a securing element 114 with a securing engagement section 114b. The securing element 114 or the securing engagement section 114b is movable into a first and a second position. In the first position, as illustrated in FIG. 4 and FIG. 4a, the securing engagement section 114b is in securing engagement with the second module part 104 (bus module part) in the first combined arrangement, with the result that the first module part (electronics module part) 102 and the second module part (bus module part) 104 are secured against one another. The securing engagement section 114b shown in FIG. 4a is a projection or bar which, in the first position, is in securing engagement with a cutout 115b of the second module part. It should be understood that this mechanical engagement can be achieved or described in any suitable manner. For example, a projection or bar of the second module part 104 may engage in a cutout in the first module part 102 or the securing element 114.

In the second position (not illustrated in FIG. 4 and FIG. 5) of the securing element 114, the securing engagement section 114b is arranged in the first combined arrangement in such a way that the first module part (electronics module part) 102 and the second module part (bus module part) 104 are detachable from one another. In the second position of the securing element 114, the first module part (electronics module part) 102 and the second module part (bus module part) 104 are therefore not secured against one another. The securing element 114 furthermore comprises a securing actuation section 114a, by means of which the securing element 114 is movable in the first combined arrangement between the first and second positions when a force is exerted on the securing actuation section 114a.

FIG. 6 shows a perspective illustration of the first exemplary embodiment of the module 100 shown in FIG. 4 and FIG. 5 in a state in which the first module part 102 in the first combined arrangement is detachable. FIG. 6a shows a corresponding cross-sectional view of the module 100 shown in FIG. 6. FIG. 7 shows a perspective illustration of the first exemplary embodiment of the module 100 shown in FIGS. 4 to 6 in a state in which the first module part 102 is detached. FIG. 7a shows a corresponding cross-sectional view of the module shown in FIG. 7.

FIG. 5 and FIG. 5a show the securing element 114 in the first position, in which the first module part (electronics module) 102 and the second module part (bus module part) 104 are secured against one another. The securing actuation section 114a is in this case arranged in the first position in a first spatial region R1. FIG. 6 and FIG. 6a show the securing element 114 in the second position, in which the first module part (electronics module part) 102 and the second module part (bus module part) 104 are detachable from one another. The securing actuation section 114a is in this case arranged in a second spatial region R2 in the second position.

The third module part 106 has a blocking section 113, which, in the second combined arrangement or state (FIG. 4 and FIG. 4a), is arranged at least partially in the second spatial region R2. In the exemplary embodiment illustrated, the blocking section 113 is a projection or comprises a projection, which makes contact with the securing actuation section 114a. Thus, a blocking section 113 is used which is designed in such a way that the securing element 114 is prevented or blocked in the first and second combined arrangements from moving into the second position, in which the first module part (electronics module part) 102 and the second module part (bus module part) 104 would be detachable from one another. The first module part (electronics module part) 102 is blocked thereby until the third module part (connection module part) 106 has been dismantled. The removal or detachment of the first module part (electronics module part) 102 from the second module part (bus module part) 104 is therefore only possible when the third module part (connection module part) 106 has been dismantled. The first module part (electronics module part) 102 can therefore not be withdrawn from the second module part (bus module part) 104 when the module is still in use, for example when voltages or signals are present at the external connections 129 of the connection module part 106. Therefore, no faults can occur on the bus and/or on a connected peripheral (for example actuator). Furthermore, a user cannot become injured by high voltages. In the exemplary embodiment illustrated, the blocking section 113 is part of the pivoting holding element 112 or coincides therewith.

In the exemplary embodiment illustrated in FIGS. 4 to 7, the securing element 114 is a lever with a defined fixpoint F. The lever is in this case a two-sided lever with a first lever part and a second lever part with respect to the fix point F. The securing actuation section 114 is located on the first lever part, and the securing engagement section 114b is located on the second lever part. By exerting a force on the securing actuation section 114 of the lever, the securing element 114 or the lever is movable between the first position (FIG. 4 and FIG. 4a, FIG. 5 and FIG. 5a) and the second position (FIG. 6 and FIG. 6a). The securing element 114 is fastened on the housing 103 of the first module part 102 and formed integrally therewith. By fastening the securing element 114 (or the lever) on the housing 103, the fixpoint F is defined.

A plane EF is defined which is arranged perpendicular to a fixpoint axis FA defined by the fixpoint F of the lever. In FIGS. 4 to 6, the fixpoint axis FA runs perpendicular to the plane of the drawing and the plane EF is in or parallel to the plane of the drawing. The securing actuation section 114a of the lever is movable in one direction in the plane EF. In other words, the securing actuation section 114a of the lever can be moved to and fro in the direction of the plane of the drawing. In the first position (FIG. 4 and FIG. 4a, FIG. 5 and FIG. 5a), the securing actuation section 114a is arranged in a first angular position in the plane EF. The securing actuation section 114a is then arranged in the first spatial region R1. In the second position (FIG. 6 and FIG. 6a), the securing actuation section 114a of the lever is arranged in another, second angular position in the plane EF. The securing actuation section 114a is then arranged in the second spatial region R2. As can be seen from FIG. 4a, the blocking section 113 in the second combined arrangement or state is arranged at least partially in a region between the first angular position and the second angular position. The projection or blocking section 113 in this case extends as far as into the region between the first angular position and the second angular position.

FIG. 8 shows a perspective illustration of a second exemplary embodiment of a module 100 comprising a first module part 102, a second module part 104 and a third module part 106 in a first and second combined arrangement. FIG. 8a shows a corresponding cross-sectional view of the module 100 shown in FIG. 8. Reference is substantially made to the statements relating to the first exemplary embodiment with reference to FIGS. 4 to 7. The difference between the second exemplary embodiment illustrated in FIG. 8 and FIG. 8a and the first exemplary embodiment shown in FIGS. 4 to 7 consists, however, in that the securing element 114 is in this case a one-sided lever. FIG. 8b shows an enlarged region X of the cross-sectional view in FIG. 8a. The securing element 114 is in the form of a one-sided lever and is illustrated in enlarged form here. The securing actuation section 114a and the securing engagement section 114b are both arranged on the one-sided lever. The securing engagement section 114b is a projection or bar which, in the first position (as illustrated in FIG. 8, FIG. 8a and FIG. 8b), is in securing engagement with a cutout 115b in the second module part 104. The cutout 115b in the second module part 104 is located in a protruding (in relation to the interface or backplane) section 138 of the housing 105 of the second module part 104.

As can be seen from FIGS. 4, 4a, 5 and 5a, the third module part 106 (connection module part) also comprises a securing element 116 with a securing engagement section 116b in order to secure the first and third module parts 102, 106 in the second combined arrangement against one another. The securing element 116 or the securing engagement section 116b is movable into a first and a second position. In the first position, as illustrated in FIG. 4a, the securing engagement section 116b is in securing engagement with the first module part 102 (electronics module part) in the second combined arrangement, with the result that the first module part (electronics module part) 102 and the third module part (connection module part) 106 are secured against one another. The securing engagement section 116b shown in FIG. 4a is a projection or bar which, in the first position, is in securing engagement with a cutout in the first module part 102. It should be understood that this mechanical engagement can be achieved or described in any suitable manner. For example, a projection or bar of the first module part 102 can also engage in a cutout in the third module part 106 or the securing element 116.

In the second position (not illustrated in FIG. 4 and FIG. 5) of the securing element 116, the securing engagement section 116b is arranged in the second combined arrangement in such a way that the first module part (electronics module part) 102 and the third module part (connection module part) 106 are detachable from one another. In the second position of the securing element 116, the first module part (electronics module part) 102 and the third module part (connection module part) 106 are therefore not secured against one another. The securing element 116 furthermore comprises a securing actuation section 116a, by means of which the securing element 116 in the second combined arrangement is movable between the first and second positions when a force is exerted on the securing actuation section 116a. In the exemplary embodiment illustrated, the securing element 116 is a (one-sided) lever with a defined fixpoint F'. The securing element 116 is fastened on the housing 107 of the third module part 106 and formed integrally therewith. By virtue of the securing element 116 (or the lever) being fastened on the housing 107, the fixpoint F' is defined.

Furthermore, the third module part 106 comprises an anti-overextension means (or anti-detachment means) 166 for protecting the securing element 116 from an overextension (or from a detachment of the third module part 106). The securing element 116 (or lever) is thus protected against overextension or detachment both during the transport and during construction (assembly of the module). As can be seen in FIGS. 4, 4a, 5 and 5a, the anti-overextension means (or anti-detachment means) 166 in this exemplary embodiment is a bar which is arranged in front of the securing element 116 of the third module part 106. By means of the bar 166, a cutout is formed in which the securing actuation section 116b is arranged. The cutout is large enough to move the securing actuation section 116b between the first and second positions.

The mechanical assembly or detachment of the first module part (electronics module part) 102 and the second module part (bus module part) 104 will be described in more detail in the following. The housing 103 of the first module part (electronics module part) 102 in this case comprises an interface 103a and the housing 105 of the second module part (bus module part) 104 comprises an interface 105a (shown in FIGS. 7 and 7a), which are opposite one another in the first combined arrangement or state (as can be seen, for example, in FIGS. 4 to 6) in such a way that a limit plane G is defined. In FIGS. 4a, 5a, 6a and 7a, the limit plane G runs horizontally into the plane of the drawing. The interfaces 105a of the second module parts (bus module parts) 104 form the backplane. The printed circuit boards 121, 121' of the first module part 102 can be introduced into corresponding cutouts (with mating contacts 130, 130' or male or female connectors 131, 131') in the housing 105 or the interface 105a of the second module part. The first module part (electronics module part) 102 and second module part (bus module part) 104 therefore lie in planar fashion one on top of the other in the limit plane G in the first combined arrangement or state.

In FIGS. 7 and 7a, the first module part (electronics module part) 102 and the second module part (bus module part) 104 are detached from one another by a pivoting movement along a defined movement path around a pivot point S. The pivoting holder element 110, which defines the pivot point S with the pivot axis A, has already been explained in connection with the mechanical assembly of the module parts. As can be seen in FIG. 7, the housing 105 of the second module part (bus module part) 104 comprises a sloping edge 136, which runs at an angle from the pivot point S. In each case one sloping edge 136 is provided on both sides of the housing 105. A guide pocket is formed in the area between the two sloping edges 136, in which guide pocket the first module part (electronics module part) 102 can be guided during pivoting. Thus, the degrees of freedom during pivoting are minimized, or the play at the pivot point is minimized. The module parts can thus be combined securely and reliably. In particular, the printed circuit board 120, 120' of the first module part (electronics module part) 102 can thus be introduced precisely or cleanly into the corresponding male or female connector 130, 130' of the second module part (bus module part) 104.

FIGS. 9 to 11 each show a further exemplary embodiment of a module 100 on a first module part 102 and a second module part 104. Reference is substantially made to the statements in relation to the first and second exemplary embodiments with reference to FIGS. 4 to 8. The difference between the exemplary embodiment illustrated in FIG. 9 and the first exemplary embodiment shown in FIGS. 4 to 7, however, relates to the fact that the guide pocket into which the pivoting holder element 110 is introduced is formed between two straight edges 137. The straight edges lie in the limit plane G or in the interface 105a. The pivoting holder element of the first module part 102 in this case extends beyond the limit plane G or the interface 103a of the first module part 103a in the form of a projection or bar. A further difference distinguishing the exemplary embodiment shown in FIG. 9 relates to the fact that the securing element 114 is formed by a planar surface. The exemplary embodiment illustrated in FIG. 10 substantially corresponds to the exemplary embodiment shown in FIG. 8. The difference between the exemplary embodiment shown in FIG. 10 and the first exemplary embodiment shown in FIGS. 4 to 7 relates to the fact that the pivoting holder element 110 in the form of a projection is not guided in a guide pocket. In order nevertheless to ensure a clean pivoting movement, in this case guides 139 are provided on both sides of the protruding (in relation to the interface G or backplane) section 138 of the housing 105. The difference between the exemplary embodiment illustrated in FIG. 11 and the first exemplary embodiment shown in FIGS. 4 to 7 relates to the fact that the pivoting holder element 110 of the first module part (electronics module part) 102 comprises a bar which is arranged in a cutout formed by the housing 103 of the second module part. More precisely, this cutout is formed by a curved projection 140 arranged on the interface 105a. The pivoting holder element 110 is in this case not formed by a protruding projection in the exemplary embodiment shown in FIG. 11, as in the first exemplary embodiment with reference to FIGS. 4 to 7, but by a bar formed in a cutout. Correspondingly, in FIG. 11, the cutout in the second module part (bus module part) 104 in which the bar 110 engages is formed by the curved projection 140.

Figure 12:
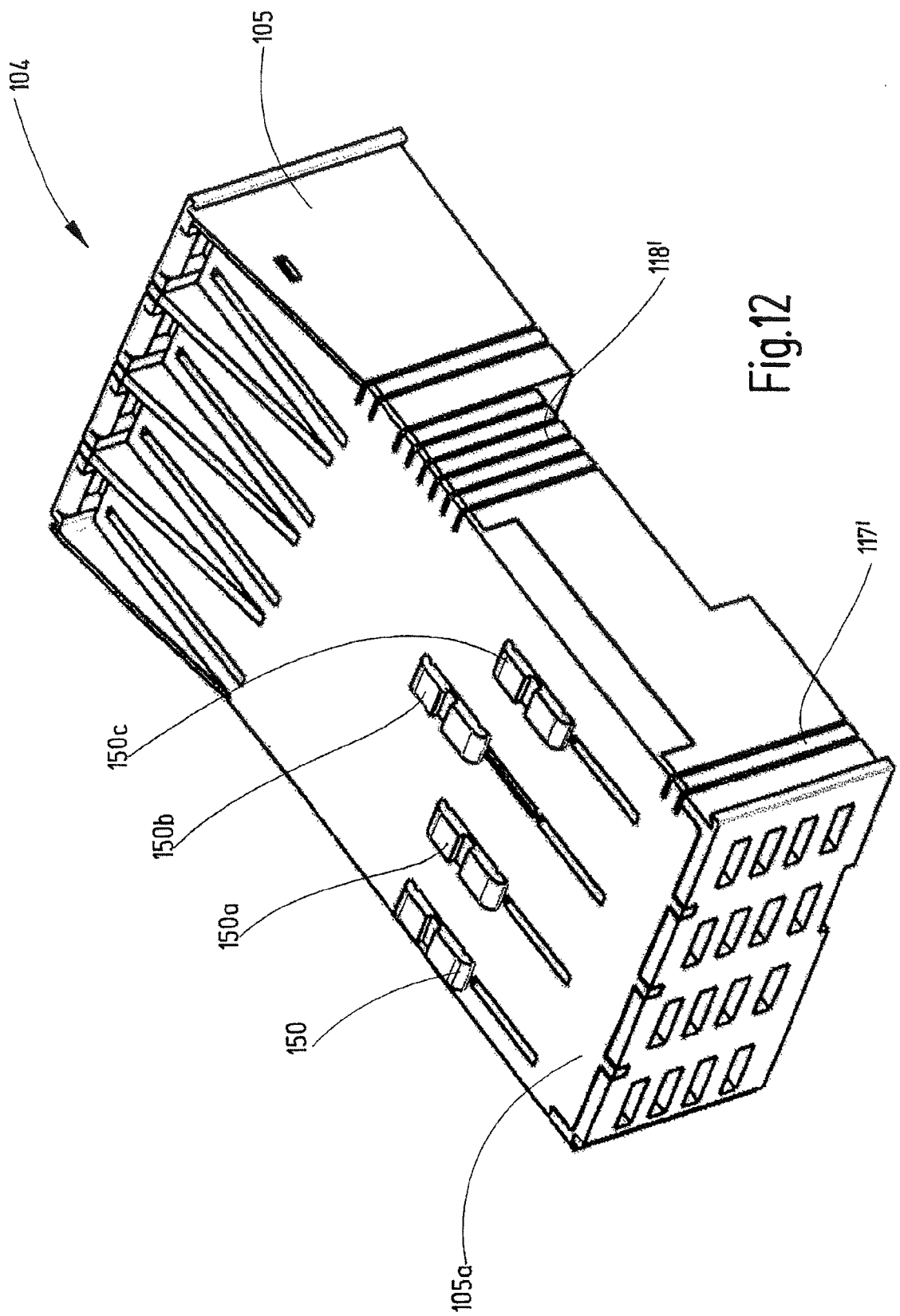
FIG. 12 shows a perspective view of an exemplary embodiment of the second module part, in particular of the second module part shown in FIGS. 2 and 3.
Figure 13:
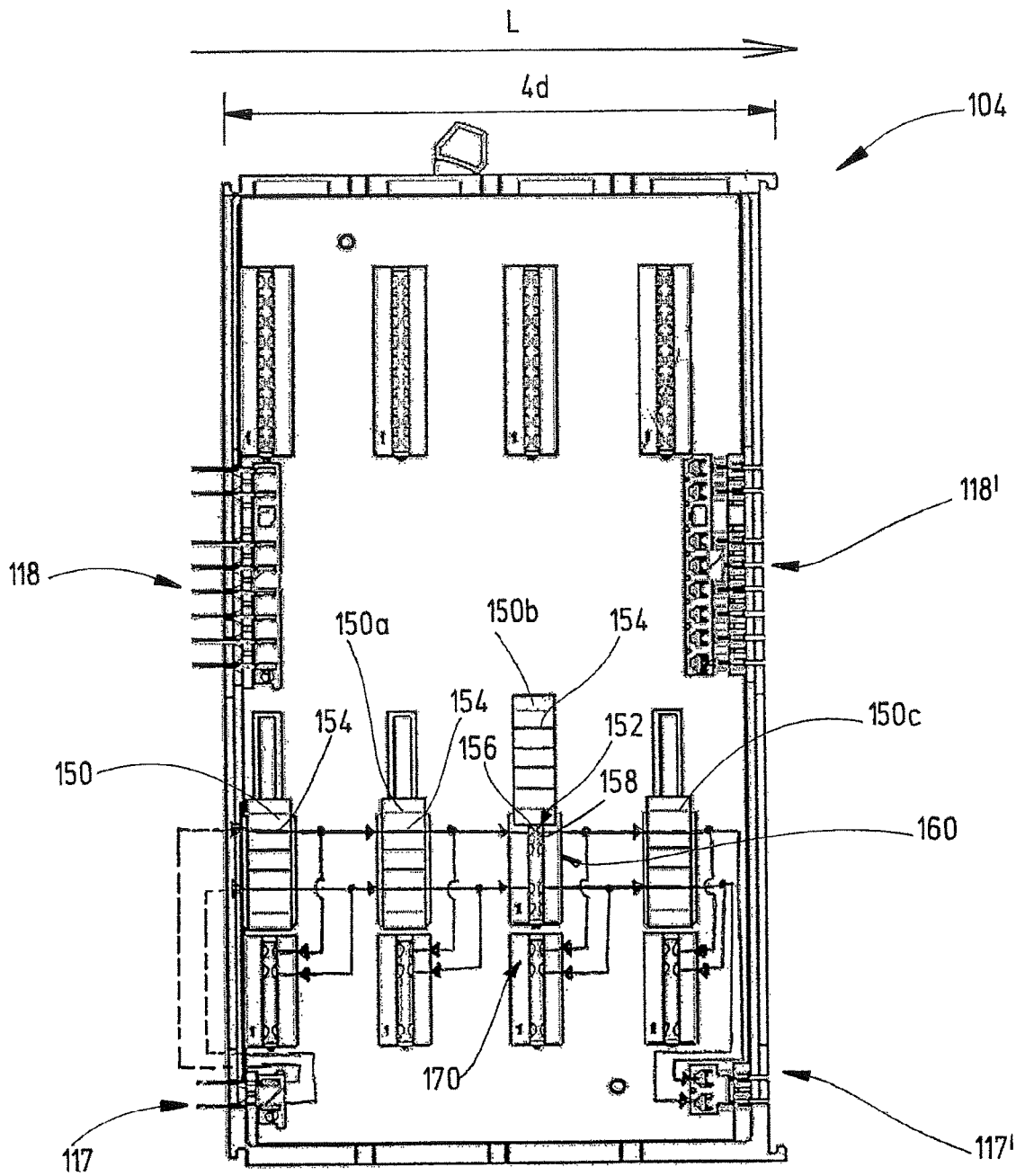
FIG. 13 shows a plan view from above of the second module part shown in FIG. 12.

FIG. 12 shows a perspective illustration of an exemplary embodiment of the second module part 104, in particular the second module part (bus module part) 104 in FIGS. 2 and 3. FIG. 13 shows a plan view from above of the second module part 104 in FIG. 12. FIG. 14 shows a perspective internal view of the second module part 104 in FIGS. 12 and 13. FIG. 14a shows an enlarged region X of the perspective view shown in FIG. 14.

The second module part (bus module part) 104 comprises at least one movable element 150, which is movable into a first position and a second position. In the first position, the movable element 150 provides an electrical connection between the first bus connector 117 and the second bus connector 117'. In the second position, the movable element 150 provides an insulation point 152 between the first bus connector 117 and the second bus connector 117'. As already explained with reference to the preceding figures, the first and second bus connectors 117, 117' are here in each case a bus connector of a supply voltage bus which connects through a supply voltage.

In the exemplary embodiment shown in FIGS. 12 to 14, the second module part (bus module part) 104 comprises a number of movable elements 150, 150a-c which corresponds to the integer n. Since the width of the second module part (bus module part) 104 in this exemplary embodiment is four times the basic width d, as already explained with reference to FIG. 2 and FIG. 3, the second module part 104 therefore comprises four movable elements 150, 150a-c. The movable elements 150, 150a-c are each movable into the first position and the second position. However, it should be understood that the second module part 104 can comprise any desired number of movable elements 150. In particular, the second module part 104 can comprise only one movable element 150, for example likewise illustrated in FIGS. 2 and 3. The function of a movable element will now be described in more detail below.

In the exemplary embodiment of the second module part (bus module part) 104 illustrated, the first movable element 150, the second movable element 150a and the fourth movable element 150c (when viewed from right to left in one direction) are in the first position. Only the third movable element 150b is in this case in the second position. As can be seen in FIG. 13, the second module part (bus module part) 104 has a first contact point 156, which is electrically connected to the first bus connector 117', and a second contact point 158, which is electrically connected to the second bus connector 117'. The insulation point 152 is located between the first contact point 156 and the second contact point 158 when the movable element 150 is in the second position (movable element 150b in FIG. 13). The insulation point 152 is in this case an air-filled region.

The movable element 150, 150a-c in each case comprises an electrical line 154, which is arranged in such a way that an electrical connection between the first contact point 156 and the second contact point 158 or between the first bus connector 117 and the second bus connector 117' is provided by the electrical line 154 when the movable element 150 is in the first position (movable element 150, 150a, 150c in FIG. 13). Each of the movable elements 150, 150a-c in this case comprise an electrical line, which is arranged in such a way that an electrical connection between the first bus connector 117 and the second bus connector 117' is provided by the electrical lines 154 when each of the movable elements 150, 150a-c is in the first position. This is not the case in the state illustrated in FIG. 13 since the movable element 150b is in the second position, i.e. not every movable element is in the first position. Each of the movable elements 150, 150a-c can therefore, in its second position, provide an insulation point 152 between the first bus connector 117 and the second bus connector 117'. In the state illustrated in FIG. 13, this is only the movable element 150b. The supply voltage bus is interrupted by this insulation point 152.

As can be seen from FIG. 14a, the movable element 150, 150a-c is a sliding element guided on a guide 164, which sliding element can be shifted between the first and second positions. The sliding element comprises a lower region (in relation to the interface 105a or backplane), on which the electrical connections are arranged, and an upper region (in relation to the interface 105a or backplane), which is designed for manual operation. As can be seen in FIG. 12, the movable element or sliding element is arranged with the upper region on or over the limit plane G or the interface 105a of the second module part 105, with the result that it is easily accessible from the outside. As can be seen in FIG. 14a, the sliding element in this exemplary embodiment is capable of being shifted linearly between the first and second positions, parallel to (or in) the interface 105a or backplane. It should be understood that the movable element or the sliding element can be movable in any other suitable manner between the first and second positions. For example, the sliding element may be capable of being shifted or rotated in angular fashion between the first and second positions about a defined center of rotation. In another example, the movable element may be a jumper, which can be or is inserted into the insulation point in the first position and can be or is removed from the control apparatus in the second position. A jumper is in this case understood to mean a separate, completely removable component with an electrical line.

The first module part (electronics module part) 102, as described with reference to the preceding figures, for example, is in this case provided in particular with a first design and a second design. The first design of the first module part (electronics module part) 102 can in this case be an input/output module part (for example for failsafe (FS) or standard (ST) applications). In the second design, the first module part (electronics module part) 102 can be a voltage supply module part (or feed module part) for feeding a module supply, i.e. an internal supply voltage, or for feeding a periphery supply, i.e. an external supply voltage, in order to form a new voltage group.

In the second design (voltage supply module part), at least one first contact 120' (in particular contacts 120' of the second group, as described previously) or printed circuit board 121' of the first module part 102 is arranged in such a way that it can be inserted into the insulation point 152. One of the contact points 156, 158 is the electrical mating contact 130 of the second module part (bus module part) 104. In the first combined arrangement, the first electrical contact 120' of the first module part (electronics module part or voltage supply module part) thus makes contact with the one contact point 156, 158 of the second module part (bus module part) for the electrical connection between the first module part 102 and the second module part 104 when the movable element 150 is in the second position. A feed connection 160 is thus provided. The feed connection 160 is used for connection to the first module part (voltage supply module part or feed module part) 102. The first module part (electronics module part) 102 therefore has, in its second design (voltage supply module part) its first electrical contact 120' arranged in such a way that, in the first combined arrangement, the first electrical contact 120 with the feed connection 160 provides an electrical connection between the first module part 102 and the second module part 104. In this way, a voltage is fed from the first module part (electronics module part or voltage supply module part) 102 onto the second module part (bus module part).

The second module part (bus module part) 104 furthermore comprises a further connector 170, which is connected to the electrical connection between the first bus connector 117 and the second bus connector 117'. The first module part (electronics module part) 102 has in the first design (input/output module part) its first electrical contact 120' or the printed circuit board 121' arranged in such a way that, in the first combined arrangement, the first electrical contact 120' together with the further connector 170 provides an electrical connection between the first module part (electronics module part or input/output module part) and the second module part (bus module part) 104.

As illustrated by arrows in FIG. 13, in this exemplary embodiment the supply voltage on the supply voltage bus is connected by the first bus connector 117 in the direction of the second bus connector 117', i.e. in this case from left to right in the longitudinal direction L. Therefore, the above-described contact point is in this case the right-hand contact point 158. Contact is therefore made with the contact point 158 by the first electrical contact 120' of the first module part 102. The first electrical contact 120' of the first module part 102 is insulated from the other contact point 156 of the second module part 104. In this way, a new voltage can be fed towards the right.

By virtue of the above-described exemplary embodiment, when the movable element 150, 150a-c is in the first position, a voltage present at one of the bus connectors 117 is connected between the first bus connector 117 and the second bus connector 117' and, when the movable element 150, 150a-c is in the second position, a galvanic disconnection is provided between the first bus connector 117 and the second bus connector 117'.

Instead of two different designs of the second module part (bus module part) 104 (one design with connected bus and one design with interrupted bus), therefore, in this case only a single design of the second module part (bus module part) 104 is required. The production costs are thus lower owing to the production of only one design of the second module part (bus module part) 104. In addition, an increased user friendliness is provided since any design of the first module part (electronics module part) 102 can be positioned onto the second module part (bus module part) 104.

Although previously a control apparatus for the automated control of a technical installation has been described, it should be understood that the control apparatus can also be used for controlling another application. Furthermore, the control apparatus can be any other apparatus in which electrical contacts of a first module part and mating contacts of a second module part are combined (by pivoting movement).

What is claimed is:
1. A control apparatus for automated control of a technical installation, comprising:
    a plurality of modules which are arranged next to one another in a longitudinal direction, wherein the modules each comprise a bus module part, and wherein a first module from the plurality of modules additionally comprises an electronics module part and a connection module part,
    wherein the electronics module part and the bus module part of said first module are mechanically and electrically combined to form a first combined arrangement, and wherein the electronics module part and the connec- tion module part of said first module are mechanically and electrically combined to form a second combined arrangement, wherein each bus module part comprises a housing having a first side and a second side opposite from the first side in the longitudinal direction, and comprises a first bus connector on the first side for electrical connection to a first neighboring bus module part adjacent in the longitudinal direction, and comprises a second bus connector on the second side for electrical connection to a second neighboring bus module part adjacent in the longitudinal direction, the first and second bus connectors establishing a supply voltage bus, wherein the connection module part comprises a first electrical contact and the electronics module part comprises a first electrical mating contact, which, in the second combined arrangement, makes contact with the first electrical contact for electrical connection between the electronics module part and the connection module part, wherein the electronics module part comprises a further electrical contact and the bus module part of said first module comprises a further electrical mating contact, which, in the first combined arrangement, makes contact with the further electrical contact for electrical connection between the electronics module part and the bus module part of said first module, wherein the bus module part of said first module further comprises at least one movable element, which is selectively movable between a first position and a second position, the movable element, in the first position, providing an electrical connection between the first bus connector and the second bus connector and, in the second position, providing an insulation point between the first bus connector and the second bus connector, wherein the connection module part further comprises an external connector for applying an external supply voltage, and wherein the electronics module part feeds the external supply voltage from the connection module part to the bus module part using the further electrical contact and the further electrical mating contact, while the movable element is in the second position.

2. The control apparatus of claim 1, wherein the bus module part has a first contact point electrically connected to the first bus connector and a second contact point electrically connected to the second bus connector, wherein the insulation point is defined between the first contact point and the second contact point when the movable element is in the second position.

3. The control apparatus of claim 2, wherein the further electrical mating contact forms the second contact point.

4. The control apparatus of claim 1, wherein a second module from the plurality of modules comprises a second electronics module part and a second connection module part, said second electronics module part being an I/O module part configured for receiving external sensor signals and for outputting actuator signals.

5. The control apparatus of claim 4, wherein the bus module part of the second module comprises a further movable element for selectively connecting through or disconnecting the supply voltage bus, the further movable element being in a position to connect through the supply voltage bus.

6. The control apparatus of claim 1, wherein the electronics module part has a basic width in the longitudinal direction, and wherein the base module part of said first module has a width in the longitudinal direction which is an integer multiple of the basic width.

7. The control apparatus of claim 6, wherein the bus module part of said first module has a width in the longitudinal direction which is four times the basic width.

8. The control apparatus of claim 6, wherein the bus module part of said first module has a number of said movable elements which number corresponds to the integer multiple.

9. The control apparatus of claim 1, wherein said at least one movable element comprises a conductive area providing an electrical connection between the first bus connector and the second bus connector when said at least one movable element is moved into the first position.

10. The control apparatus of claim 1, wherein the insulation point is an air filled gap when said at least one movable element is in the second position.

11. The control apparatus of claim 1, wherein said at least one movable element is a sliding element guided on a guide so as to be capable of shifting between the first and second positions.

12. A control apparatus for the automated control of a technical installation, comprising a plurality of modules which are arranged next to one another in a longitudinal direction, wherein the modules each comprise a bus module part, said bus module part comprising a housing, wherein said bus module part further comprises at least one first electrical bus connector on a first side of the housing for electrical connection to a first neighboring bus module part which is adjacent in the longitudinal direction, and wherein said bus module part further comprises at least one second electrical bus connector on a second side of the housing, opposite the first side, for electrical connection to a second neighboring bus module part which is adjacent in the longitudinal direction, said first and second bus connectors thereby establishing a supply voltage bus for carrying a supply voltage, wherein said bus module part comprises at least one movable element, which is movable between a first position and a second position, wherein the at least one movable element, in the first position, provides an electrical connection between the first bus connector and the second bus connector in order to connect through the supply voltage and, in the second position, provides an insulation point between the first bus connector and the second bus connector.

13. The control apparatus of claim 12, wherein a first module from the plurality of modules further comprises a first electronics module part having a first design, and wherein a second module from the plurality of modules further comprises a second electronics module part having a second design, wherein the first design has a first electrical contact arranged in such a manner that the electrical connection between the first bus connector and the second bus connector of the respective bus module part is connected, and wherein the second design has a second electrical contact arranged in such a manner that the electrical connection between the first bus connector and the second bus connector of the respective bus module part is disconnected.

* * * * *